US006919152B2

(12) United States Patent
Sreenivasan et al.

(10) Patent No.: US 6,919,152 B2
(45) Date of Patent: Jul. 19, 2005

(54) HIGH RESOLUTION OVERLAY ALIGNMENT SYSTEMS FOR IMPRINT LITHOGRAPHY

(75) Inventors: S. V. Sreenivasan, Austin, TX (US); Byung J. Choi, Round Rock, TX (US); Matthew Colburn, Austin, CT (US); Todd Bailey, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 10/445,863

(22) Filed: May 27, 2003

(65) Prior Publication Data

US 2004/0086793 A1 May 6, 2004

Related U.S. Application Data

(62) Division of application No. 09/907,512, filed on Jul. 16, 2001, now abandoned.
(60) Provisional application No. 60/218,568, filed on Jul. 16, 2000.

(51) Int. Cl.⁷ ............................. G03F 9/00; G03B 17/00
(52) U.S. Cl. ......................... 430/30; 430/22; 101/130; 101/131; 101/DIG. 36; 396/428
(58) Field of Search .................. 430/22, 30; 101/130, 101/131, DIG. 36; 396/428

(56) References Cited

U.S. PATENT DOCUMENTS

| | | |
|---|---|---|
| 3,783,520 A | 1/1974 | King |
| 4,119,688 A | 10/1978 | Hiraoka |
| 4,201,800 A | 5/1980 | Alcorn et al. |
| 4,256,829 A | 3/1981 | Daniel |
| 4,326,805 A | 4/1982 | Feldman |
| 4,426,247 A | 1/1984 | Tamamura et al. |
| 4,507,331 A | 3/1985 | Hiraoka |
| 4,552,833 A | 11/1985 | Ito et al. |
| 4,657,845 A | 4/1987 | Frechet et al. |
| 4,692,205 A | 9/1987 | Sachdev et al. |
| 4,707,218 A | 11/1987 | Giammarco et al. |
| 4,724,222 A | 2/1988 | Feldman |
| 4,737,425 A | 4/1988 | Lin et al. |
| 4,808,511 A | 2/1989 | Holmes |
| 4,826,943 A | 5/1989 | Ito et al. |
| 4,857,477 A | 8/1989 | Kanamori |
| 4,891,303 A | 1/1990 | Garza et al. |
| 4,931,351 A | 6/1990 | McColgin et al. |
| 4,976,818 A | 12/1990 | Hashimoto et al. |
| 4,999,280 A | 3/1991 | Hiraoka |
| 5,071,694 A | 12/1991 | Uekita et al. |
| 5,074,667 A | 12/1991 | Miyatake |
| 5,148,036 A | 9/1992 | Matsugu et al. |
| 5,151,754 A | 9/1992 | Ishibashi et al. |
| 5,169,494 A | 12/1992 | Hashimoto et al. |
| 5,173,393 A | 12/1992 | Sezi et al. |
| 5,198,326 A | 3/1993 | Hashimoto et al. |
| 5,234,793 A | 8/1993 | Sebald et al. |
| 5,314,772 A | 5/1994 | Kozicki et al. |
| 5,414,514 A | 5/1995 | Smith et al. |
| 5,527,662 A | 6/1996 | Hashimoto et al. |
| 5,654,238 A | 8/1997 | Cronin et al. |
| 5,700,626 A | 12/1997 | Lee et al. |
| 5,736,424 A | 4/1998 | Prybyla et al. |
| 5,737,064 A | 4/1998 | Inoue et al. |
| 5,802,914 A * | 9/1998 | Fassler et al. ................ 74/110 |
| 5,808,742 A | 9/1998 | Everett et al. |
| 5,895,263 A | 4/1999 | Carter et al. |
| 5,907,782 A | 5/1999 | Wu |
| 5,926,690 A | 7/1999 | Toprac et al. |
| 5,948,570 A | 9/1999 | Kornblit et al. |
| 6,033,977 A | 3/2000 | Gutsche et al. |
| 6,088,103 A | 7/2000 | Everett et al. |
| 6,096,655 A | 8/2000 | Lee et al. |
| 6,150,231 A | 11/2000 | Muller et al. |
| 6,245,581 B1 | 6/2001 | Bonser et al. |
| 6,274,294 B1 | 8/2001 | Hines |
| 6,329,256 B1 | 12/2001 | Ibok |
| 6,383,928 B1 | 5/2002 | Eissa |
| 6,387,783 B1 | 5/2002 | Furukawa et al. |
| 6,388,253 B1 | 5/2002 | Su |
| 6,391,798 B1 | 5/2002 | DeFelice et al. |
| 6,455,411 B1 | 9/2002 | Jiang et al. |
| 6,489,068 B1 | 12/2002 | Kye |

(Continued)

FOREIGN PATENT DOCUMENTS

| | | |
|---|---|---|
| JP | 02-24848 | 1/1990 |
| JP | 02-92603 | 4/1990 |
| WO | WO 00/21689 | 4/2000 |
| WO | WO 01/47003 | 6/2001 |

OTHER PUBLICATIONS

White et al., Novel alignment system for imprint lithography, J. Vac. Sci. Technol. B 18(6), Nov./Dec. 2000, pp. 3552–3556.*

Feldman et al., "Wafer chuck for manification correction in x–ray lithography," American Vacuum Society, 1998, pp. 3478–3479.

Feynman, Richard P., "There's Plenty of Room at the Bottom—An Invitation to Enter a New Field of Physics," 12 pp [online[ Retrieved Sep. 23, 2004 from URL: http://www.zyvex.com/nanotech/feynman.html.

Abstract of Japanese Patent 02–92603.

Translation of Japanese Patent 02–92603.

(Continued)

Primary Examiner—Christopher G. Young
(74) Attorney, Agent, or Firm—Kenneth C. Brooks

(57) ABSTRACT

A system of determining and correcting alignment during imprint lithography process is described. During an imprint lithographic process the template may be aligned with the substrate by the use of alignment marks disposed on both the template and substrate. The alignment may be determined and corrected for before the layer is processed.

28 Claims, 37 Drawing Sheets

U.S. PATENT DOCUMENTS

| | | |
|---|---|---|
| 6,514,672 B2 | 2/2003 | Young et al. |
| 6,522,411 B1 | 2/2003 | Moon et al. |
| 6,561,706 B2 | 5/2003 | Singh et al. |
| 6,565,928 B2 | 5/2003 | Sakamoto et al. |
| 6,632,742 B2 | 10/2003 | Yang et al. |
| 6,635,581 B2 | 10/2003 | Wong |
| 6,646,662 B1 | 11/2003 | Nebashi et al. |
| 6,677,252 B2 | 1/2004 | Marsh |
| 6,703,190 B2 | 3/2004 | Elian et al. |
| 6,713,238 B1 | 3/2004 | Chou et al. |
| 6,716,767 B2 | 4/2004 | Shih et al. |
| 6,719,915 B2 | 4/2004 | Willson et al. |
| 6,730,256 B1 | 5/2004 | Bloomstein et al. |
| 6,737,202 B2 | 5/2004 | Gehoski et al. |
| 6,743,713 B2 | 6/2004 | Mukherjee-Roy et al. |
| 6,767,983 B1 | 7/2004 | Fujiyama et al. |
| 6,770,852 B1 | 8/2004 | Steger |
| 6,776,094 B1 | 8/2004 | Whitesides et al. |
| 6,777,170 B1 | 8/2004 | Bloomstein et al. |
| 6,790,763 B2 | 9/2004 | Kondo et al. |
| 6,842,229 B2 | 1/2005 | Sreenivasan et al. |
| 2002/0150398 A1 * | 10/2002 | Choi et al. .................. 396/428 |
| 2003/0113638 A1 | 6/2003 | Mancini et al. |
| 2003/0129542 A1 | 7/2003 | Shih et al. |
| 2003/0179354 A1 | 9/2003 | Araki et al. |
| 2003/0215577 A1 | 11/2003 | Willson et al. |
| 2004/0007799 A1 | 1/2004 | Choi et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0029041 A1 | 2/2004 | Shih et al. |
| 2004/0053146 A1 | 3/2004 | Sreenivasan et al. |
| 2004/0089979 A1 | 5/2004 | Rubin |
| 2004/0090611 A1 | 5/2004 | Choi et al. |
| 2004/0104641 A1 | 6/2004 | Choi et al. |
| 2004/0112881 A1 | 6/2004 | Choi et al. |
| 2004/0141163 A1 | 7/2004 | Bailey et al. |
| 2004/0149687 A1 | 8/2004 | Choi et al. |
| 2004/0163563 A1 | 8/2004 | Bailey et al. |
| 2004/0168586 A1 | 9/2004 | Bailey et al. |
| 2004/0168588 A1 | 9/2004 | Choi et al. |
| 2004/0169441 A1 | 9/2004 | Choi et al. |
| 2004/0169994 A1 | 9/2004 | Sreenivasan et al. |
| 2004/0170771 A1 | 9/2004 | Bailey et al. |
| 2004/0189996 A1 | 9/2004 | Sreenivasan et al. |
| 2004/0200411 A1 | 10/2004 | Willson et al. |
| 2004/0209177 A1 | 10/2004 | Sreenivasan et al. |
| 2004/0223131 A1 | 11/2004 | Choi et al. |
| 2004/0251775 A1 | 12/2004 | Choi et al. |

OTHER PUBLICATIONS

Abstract of Japanese Patent 02–24848.

Translation of Japanese Patent 02–24848.

Heidari et al., "NanoImprint Lithography at the 6 In. Wafer Scale," Journal of Vacuum Science Technology, Nov./Dec. 2000, pp. 3557–3560, vol. B, No. 18(6)/.

NERAC.COM Retro Search, "Reduction of Dimension of Contact Holes", Aug. 31, 2004.

NERAC.COM Retro Search, "Trim Etching of Features Formed on an Organic Layer", Sep. 2, 2004.

NERAC.COM Retro Search, "Multilayer Resists Materials", Sep. 2, 2004.

U.S. Appl. No. 10/614,716, filed Jul. 7, 2003, entitled: Conforming Template for Patterning Liquids Disposed on Substrates, naming inventors Sreenivasan et al.

U.S. Appl. No. 10/785,248, filed Feb. 24, 2004, entitled: Method to Control the Relative Position Between a Body and a Substrate, naming inventors Sreenivasan et al.

U.S. Appl. No. 10/864,214, filed Jun. 9, 2004, entitled: Imprint Lithography System to Products a Light to Impinge upon and Polymerize a Liquid in Superimposition with Template Overlay Marks, naming inventors Sreenivasan et al.

U.S. Appl. No. 10/923,629, filed Aug. 20, 2004, entitled: Apparatus for Imprint Lithography Using an Electric Field, naming inventors Sreenivasan et al.

U.S. Appl. No. 10/978,285, filed Oct. 29, 2004, entitled: Step and Flash Imprint Lithography, naming inventors Willson et al., filed Feb. 22, 2005.

* cited by examiner

Top
Bottom

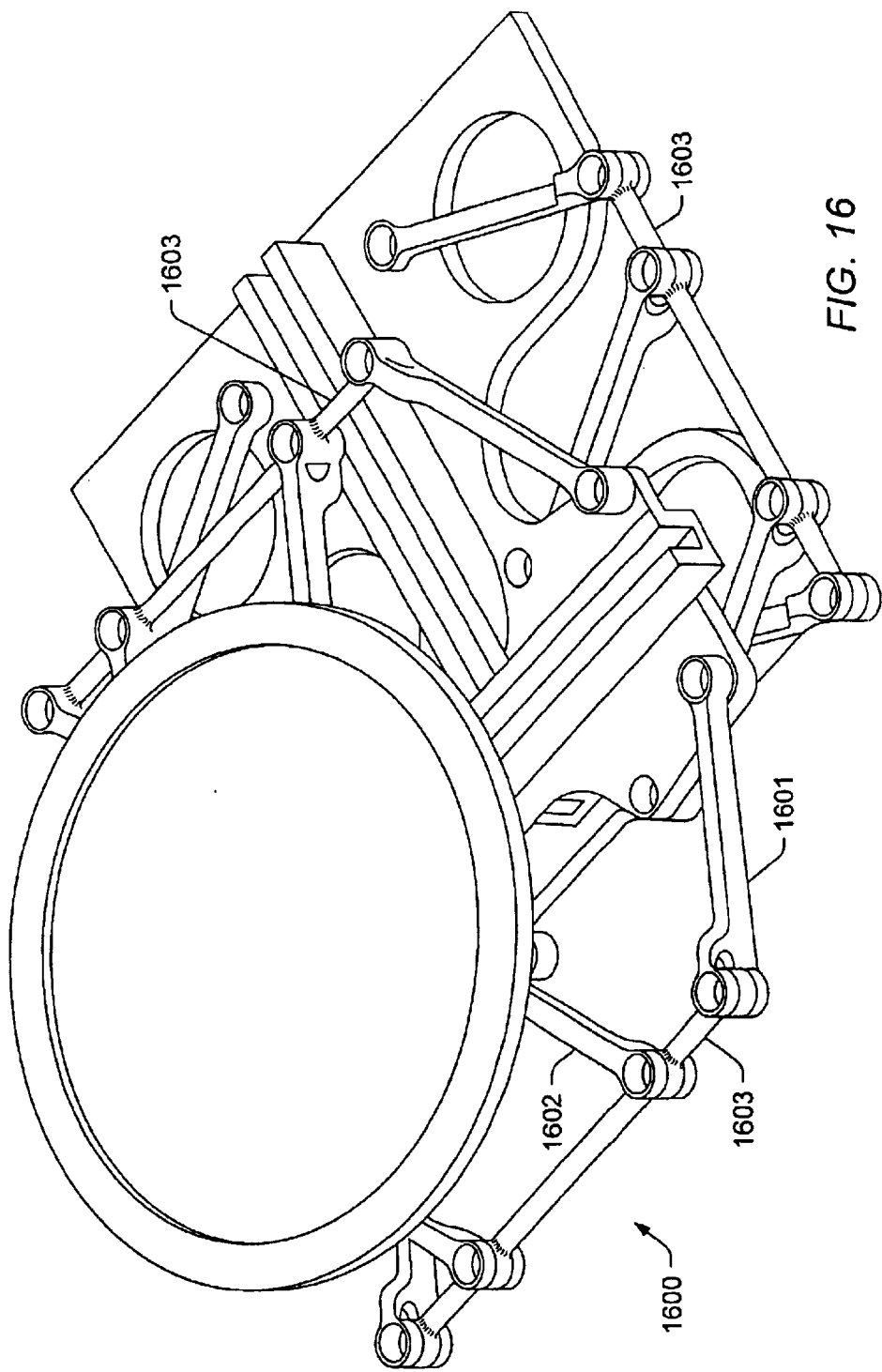

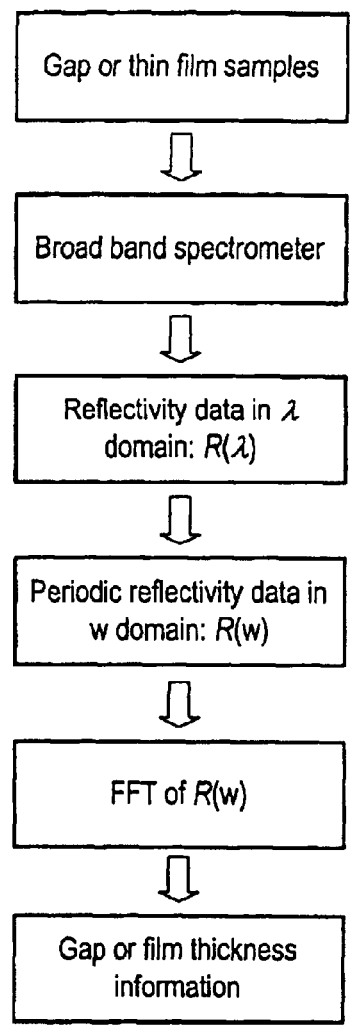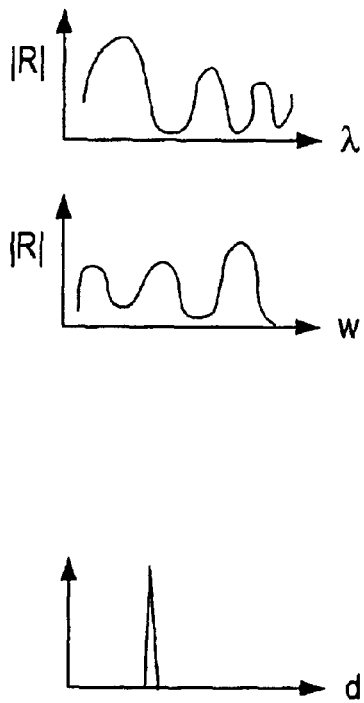
FIG. 34

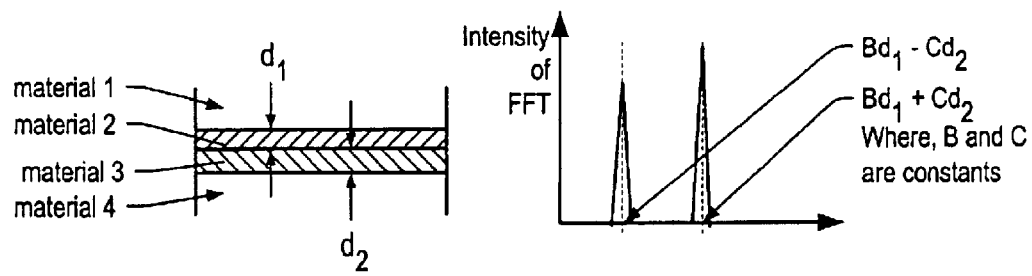
FIG. 35
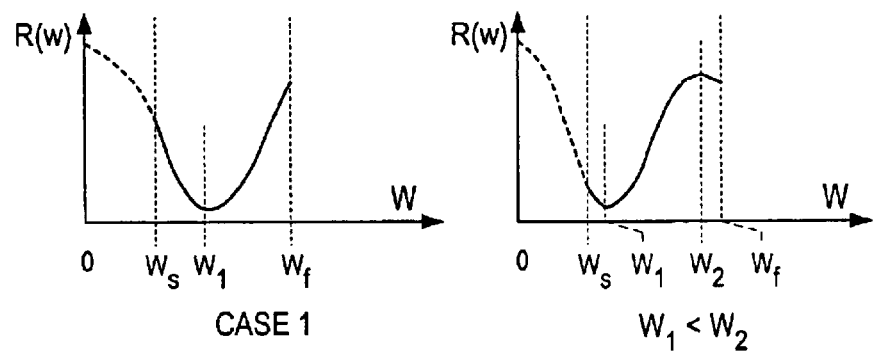
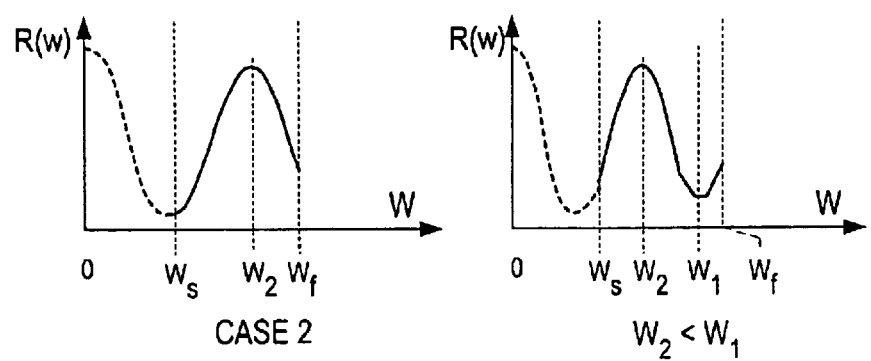
FIG. 36

HIGH RESOLUTION OVERLAY ALIGNMENT SYSTEMS FOR IMPRINT LITHOGRAPHY

CROSS-REFERENCE TO RELATED APPLICATIONS

The present application is a divisional of U.S. Patent application Ser. No. 09/907,512 filed on Jul. 16, 2001 entitled "High-Resolution Overlay Alignment Methods and Systems for Imprint Lithography, now abandoned," which claims priority to U.S. Provisional Patent Application No. 60/218,568 filed on Jul. 16, 2000 entitled "High-Resolution Overlay Alignment Methods and Systems for Imprint Lithography," both of which are incorporated by reference herein.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of N66001-98-1-8914 awarded by the Defense Advanced Research Projects Agency (DARPA).

BACKGROUND OF THE INVENTION

The present invention relates to methods and systems to achieve high-resolution overlay alignment for imprint lithography processes.

Imprint lithography is a technique that is capable of printing features that are smaller than 50 nm in size on a substrate. Imprint lithography may have the potential to replace photolithography as the choice for semiconductor manufacturing in the sub-100 nm regime. Several imprint lithography processes have been introduced during 1990s. However, most of them have limitations that preclude them from use as a practical substitute for photolithography. The limitations of these prior techniques include, for example, high temperature variations, the need for high pressures and the usage of flexible templates.

Recently, imprint lithography processes may be used to transfer high resolution patterns from a quartz template onto substrate surfaces at room temperature and with the use of low pressures. In the Step and Flash Imprint Lithography (SFIL) process, a rigid quartz template is brought into indirect contact with the substrate surface in the presence of light curable liquid material. The liquid material is cured by the application of light and the pattern of the template is imprinted into the cured liquid.

Using a rigid and transparent template makes it possible to implement high resolution overlay as part of the SFIL process. Also the use of a low viscosity liquid material that can be processed by light curing at low pressures and room temperatures lead to minimal undesirable layer distortions. Such distortions can make overlay alignment very difficult to implement.

Overlay alignment schemes typically include measurement of alignment errors between a template and the substrate, followed by compensation of these errors to achieve accurate alignment. The measurement techniques that are used in proximity lithography, x-ray lithography, and photolithography (such as laser interferometry, capacitance sensing, automated image processing of overlay marks on the mask and substrate, etc) may be adapted for the imprint lithography process with appropriate modifications. The compensation techniques have to be developed keeping in mind the specific aspects of imprint lithography processes.

Overlay errors that typically need to be compensated for include placement errors, theta error and magnification error. Overlay measurement techniques have been significantly improved during recent years as the minimum line width of photolithography processes have continued to shrink. However, these techniques may not be directly applicable to the imprint lithography processes.

SUMMARY OF THE INVENTION

The embodiments described herein include methods and systems that are applicable for overlay alignment scheme in imprint lithography processes.

In general a method of forming a pattern on a substrate may be accomplished by applying a light curable liquid to a substrate. The light curable liquid may include any liquid curable by the application of light. Typically light curable compositions are compositions that may undergo a chemical change in the presence of light. Light that may induce a chemical change includes ultraviolet light (e.g., light having a wavelength between about 300 nm to about 400 nm), actinic light, visible light, infrared light and radiation sources such as electron beam and x-ray sources. Chemical changes may be manifested in a number of forms. A chemical change may include, but is not limited to, any chemical reaction that causes a polymerization to take place. In some embodiments the chemical change causes the formation of an initiator species within the lens forming composition, the initiator species being capable of initiating a chemical polymerization reaction.

In an embodiment, the light curable composition may be a photoresist composition. Photoresist compositions include any composition that is curable by exposure to UV light. A characteristic of photoresist compositions is that only the portion of the composition that is exposed to light (e.g., ultraviolet light) may undergo a chemical reaction. Any of a variety of photoresist materials commonly used in the semiconductor industry may be used. In one embodiment, the light curable composition includes an acylate monomer.

In most photolithographic processes, photoresist materials typically have a high viscosity (greater than about 20 centipoises (cps). In imprint lithography, the use of high viscosity liquids may make it more difficult to produce sub 100 nm structures. It has been found that low viscosity liquids produce much more accurate reproduction of sub 100 nm structures. In one embodiment, the light curable liquid may have a viscosity below about 20 cps, preferably below about 10 cps, and more preferably below about 5 cps.

After the light curable liquid is applied to the substrate, the patterned template is oriented above the portion of the substrate to which the light curable liquid was applied. In the semiconductor processing, a plurality of semiconductor devices may be formed on a single substrate. Each individual semiconductor device may be formed of a plurality of layers. These layers may be sequentially formed with each layer overlying the previously formed layer. Because of the small feature size of the individual components of semiconductor devices, the alignment of each layer with respect to the other layers may be crucial to the proper functioning of the semiconductor device. A method and system for aligning a patterned template with a predetermined location on a substrate is herein described.

In one embodiment, the patterned template may include a template alignment mark. The substrate may include a substrate alignment mark. After the patterned template is positioned over the substrate, the alignment of the template alignment mark with respect to the substrate alignment mark is determined. If the template alignment mark does not align with the substrate alignment mark the orientation of the patterned template with respect to the substrate may be altered until the marks are substantially aligned. Moving the substrate with respect to the template may compensate errors in which the template alignment mark and the substrate alignment mark are offset in the X-Y direction. This may be accomplished by a substrate support stage configured to allow controlled movement of the substrate in the X-Y direction. Theta errors may be corrected by altering the angle of the template with respect to the substrate. Magnification errors may be corrected by altering the physical dimensions of the template.

A variety of alignment marks may be formed in either the template and/or the substrate. In some embodiments, the alignment mark may be formed by etching a portion of the template with a predetermined pattern. Alternatively, a thin film of a second material may be formed on the template. The second material may be deposited in a pattern that is complementary to the substrate alignment mark. The second material may be opaque to light, however, the pattern of the template alignment mark may be reproduced in the cured liquid on the substrate. Alternatively, the second material may be substantially transparent to the wavelengths of light that are used to cure the light curable liquid. The second material, however, may have different optical properties at non-curing wavelengths of light. When analyzed using an analyzer at the non-curing wavelengths of light, the alignment mark may be readily detected. During curing, however, the alignment mark is substantially transparent to the curing light and the liquid under the alignment mark may be substantially cured. In one embodiment, the deposited second material is $Si_2O_3$. In another embodiment, the template alignment mark may be produced by etching of the template. The template alignment mark may be formed from a series of parallel lines that together act as a diffraction grating. The diffraction grating template alignment mark may be readily observable when determining the alignment of the template alignment mark with respect to the substrate alignment mark. During curing, however, the diffraction grating template alignment mark may be substantially transparent to the curing light, due to the relative large spacing of the etched lines with respect to the wavelengths of light used for curing.

A variety of sensing methods may be used to determine the alignment of the template alignment mark and the substrate alignment mark. In one embodiment, images of the alignment marks on the template and substrate are focused on the same imaging plane. This focusing may be accomplished by the use of illumination sources with two distinct wavelengths and an image processing technique to separate focused images from out-of-focus images. Alternatively, images of the alignment marks on the template and substrate may be focused on the same imaging plane by using two distinct illumination sources with polarization and polarizing arrays above the template surface. In another alternative, Moirépattern-based alignment error measurement techniques may be used. During Moirépatterned-based alignment the gap where the measurement is taken may be made as small as it possible without template-substrate contact in order to minimize focusing problems of the two layers of the Moiré patterns. A high resolution (sub 100 nm) measurement and active control of gap over the entire template-substrate interface may be used. Any of these sensing methods may be used in conjuction with any of the above-described alignment marks.

In some embodiments, the gap between the patterned template and the substrate may be substantially filled prior to determining the alignment of the template and the substrate alignment marks. In other embodiments, the substrate and/or the patterned template alignment marks may be difficult to visualize when the gap between the patterned template and the substrate is substantially filled with liquid. In another embodiment, the liquid may be disposed on the substrate in a predetermined pattern. When the template is brought into contact with the liquid, only a portion of the template may be in contact with the liquid. By controlling the pattern of liquid applied to the substrate and the location of the alignment mark on the substrate, the template may be positioned in contact with the liquid such that a portion of the template that includes the alignment mark is not in contact with a liquid. In this manner the template alignment mark may be aligned with the substrate alignment mark without the interference of the liquid. After the template alignment mark is aligned with the substrate alignment mark the patterned template may be positioned with respect to the substrate such that the gap between the patterned template and the substrate in substantially filled.

Alternatively, when the template is brought into contact with the liquid, only a portion of the template may be in contact with the template. By controlling the pattern of liquid applied to the substrate and the location of the alignment mark on the substrate, the template may be positioned in contact with the liquid such that a portion of the template that includes the alignment mark is not in contact with a liquid. In this manner the template alignment mark may be aligned with the substrate alignment mark without the interference of the liquid. After initial contact of the template with the liquid, the pattern of liquid will spread out beneath the template until the liquid substantially fills the gap between the template and the substrate. Alignment of the template alignment mark and the substrate alignment mark may be accomplished as the gap is filing up with liquid.

In some embodiments, the template may need to be corrected for magnification errors induced on the substrate from processing of the previous layer. Magnification errors may occur when a template or photolithographic mask used to process a previous layer is not properly adjusted. Such masks or templates may be too large or too small during processing and lead to layers that are larger or smaller than expected. Typically such errors may be in the range of about 1 to 5 nm in size. To compensate for magnification errors, a template adjustment device may be coupled to a support configured to hold the template during use. The template adjustment device may be configured to alter the size of the template during use. By applying forces or altering the temperature of the template, the template may be enlarged or contracted. Enlarging or contracting the template may correct for magnification errors.

After alignment of the template alignment mark and the substrate alignment mark is complete, the processing may be completed. Curing light may be applied to the light curable liquid. The curing light causes the liquid to at least partially cure. After the liquid is at least partially cured, the template may be removed and the cured liquid will include structures that are complementary to the pattern etched onto the template.

The above-described alignment methods may be used for local alignment processing or global alignment processing. Local alignment processing may be used to process a plurality of semiconductor devices on a substrate. After forming a patterned layer on a first semiconductor device, a patterned template may be used to form the same patterned layer for a second semiconductor device. The substrate may be moved to a new position for processing of the second semiconductor device. In local alignment processing, the template may be realigned with the substrate when moved to the new portion of the substrate using the alignment marks on the template and substrate. In this manner, alignment may be assured for each semiconductor device produced.

Using a separate alignment for each semiconductor device produced on a substrate may be a time intensive process. To minimize processing delays, global alignment processing may be used. Global alignment processing uses an initial alignment evaluation to allow processing of additional devices without further alignment. In one embodiment, an alignment of the template with the substrate may be performed at a first portion of the substrate. After the template is aligned with the substrate a patterned layer may be formed using the above-described imprint lithography process. The positioning of the template with respect to the substrate in order to achieve the correct alignment may be herein referred to as the "calibration orientation." The calibration orientation may be determined by looking at a single portion of the substrate or at multiple portions of the substrate. The calibration orientation may be determined and recorded. After processing, the template may be moved (commonly referred to as "stepped") to the next portion of the substrate to be processed. The movement of the substrate with respect to the template may be very precisely controlled such that the change in position of the substrate with respect to the template may be accurately determined. After movement of the substrate, the orientation of the template with respect to the substrate may be determined and compared the calibration orientation. The template position may be altered to match the calibration orientation without having to check the alignment of the template with alignment marks. This may improve processing speed and overall throughput when using imprint lithography processing.

The X-Y placement errors induced during the processing of multiple portions of a substrate may be measured and compensated using capacitance sensors or laser interferometry. The resolution of these sensors can be sub-nanometer. The sides of template may be either coated with a thin layer of conductive metals or reflective materials for implementing capacitive and interferometric sensing, respectively.

During the processing of semiconductor devices, a plurality of layers may be formed to create the device. Each layer is overlaid upon a previously formed layer during processing. In some embodiments each layer formed on the substrate may include an alignment mark. The alignment mark on the substrate may be formed from a structure disposed on the patterned template that will imprint the alignment mark onto the formed layer. In one embodiment, a template may include a template alignment mark and an imprinting mark. The alignment mark may be used to align the template with the substrate by comparing the orientation of the substrate alignment mark with the template alignment mark. The imprinting mark may be used to create a new substrate alignment mark on the formed layer. The new substrate alignment mark may be used to align the template with the substrate during the production of additional layers.

An advantage of the above-described embodiments is that by measuring and Correcting overlay errors while the template and substrate o are maintained at an optimal gap, the error correction can be achieved by avoiding stiction and high viscous friction. This optimal gap is high enough to avoid stiction and high viscous friction, while it is low enough that the induced overlay error during the closing-gap motion between the template and substrate can be also minimized.

BRIEF DESCRIPTION OF THE DRAWINGS

Other objects and advantages of the invention will become apparent upon reading the following detailed description and upon reference to the accompanying drawings in which:

FIG. 16 depicts a projection view of a substrate support system;

FIG. 34 depicts a process flow of a gap measurement technique;

FIG. 35 depicts a cross sectional view of a technique for determining the gap between two materials;

FIG. 36 depicts a graphical representation for determining local minimum and maximum of a gap;

Figure 1A:
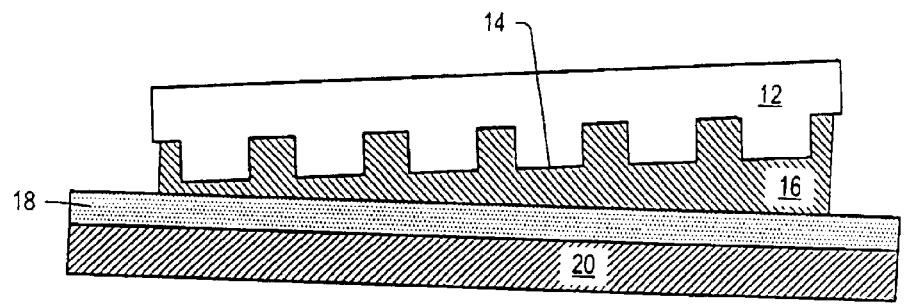
FIGS. 1A and 1B depict a cross-sectional view of the gap between a template and a substrate.

While the invention is susceptible to various modifications and alternative forms, specific embodiments thereof are shown by way of example in the drawing and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Embodiments presented herein generally relate to systems, devices, and related processes of manufacturing small devices. More specifically, embodiments presented herein relate to systems, devices, and related processes of imprint lithography. For example, these embodiments may have application to imprinting very small features on a substrate, such as a semiconductor wafer. It should be understood that these embodiments may also have application to other tasks, for example, the manufacture of cost-effective Micro-Electro-Mechanical Systems (or MEMS). Embodiments may also have application to the manufacture of other kinds of devices including, but not limited to: patterned magnetic media for data storage, micro-optical devices, biological and chemical devices, X-ray optical devices, etc.

Figure 1B:
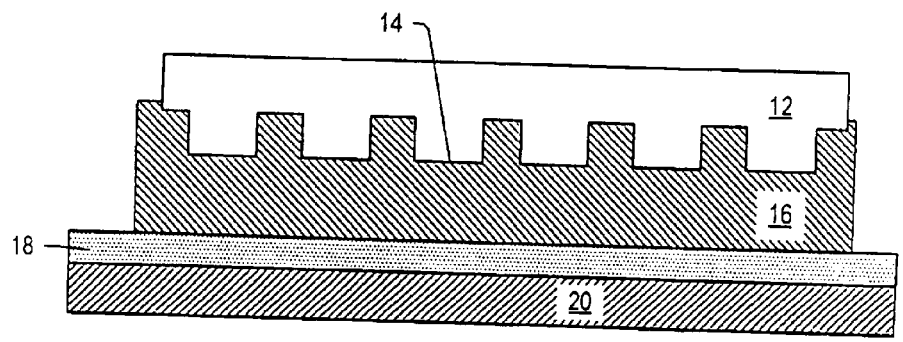

With reference now to the figures, and specifically to FIGS. 1A and 1B, therein are shown arrangements of a template 12 predisposed with respect to a substrate 20 upon which desired features are to be imprinted using imprint lithography. Specifically, the template 12 may include a surface 14 that is fabricated to take on the shape of desired features which, in turn, may be transferred to the substrate 20. In some embodiments, a transfer layer 18 may be placed between the substrate 20 and the template 12. Transfer layer 18 may receive the desired features from the template 12 via imprinted layer 16. As is well known in the art, transfer layer 18 may allow one to obtain high aspect ratio structures (or features) from low aspect ratio imprinted features.

For the purpose of imprint lithography, it is important to maintain the template 12 and substrate 20 as close to each other as possible and nearly parallel. For example, for features that are about 10 $\mu$m wide and about 100 nm deep, an average gap of about 200 nm or less with a variation of less than about 50 nm across the imprinting area of the substrate 20 may be required for the imprint lithography process to be successful. Embodiments presented herein provide a way of controlling the spacing between the template 12 and substrate 20 for successful imprint lithography given such tight and precise gap requirements.

FIGS. 1A and 1B illustrate two types of problems that may be encountered in imprint lithography. In FIG. 1A, a wedge shaped imprinted layer 16 results because the template 12 is closer to the substrate 20 at one end of the imprinted layer 16. FIG. 1A illustrates the importance of maintaining template 12 and substrate 20 substantially parallel during pattern transfer. FIG. 1B shows the imprinted layer 16 being too thick. Both of these conditions may be highly undesirable. Embodiments presented herein provide systems, processes and related devices which may eliminate the conditions illustrated in FIGS. 1A and 1B as well as other orientation problems associated with prior art lithography techniques.

Figure 2A:
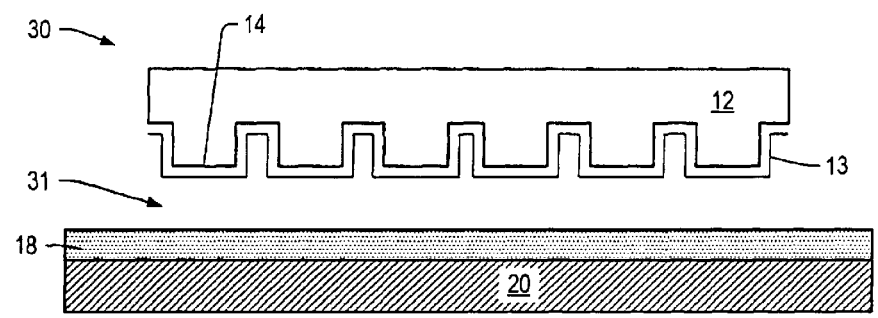
FIGS. 2A–2E depict cross-sectional views of an imprint lithography process.
Figure 2B:
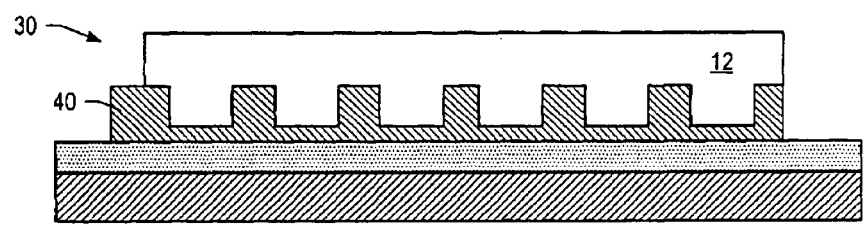
Figure 2C:
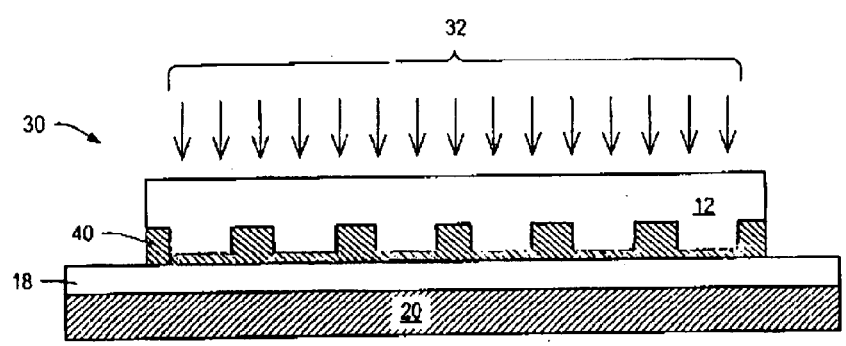

FIGS. 2A through 2E illustrate an embodiment of an imprint lithography process, denoted generally as 30. In FIG. 2A, template 12 may be orientated in spaced relation to the substrate 20 so that a gap 31 is formed in the space separating template 12 and substrate 20. Surface 14 of template 12 may be treated with a thin layer 13 that lowers the template surface energy and assists in separation of template 12 from substrate 20. The manner of orientation and devices for controlling gap 31 between template 12 and substrate 20 are discussed below. Next, gap 31 may be filled with a substance 40 that conforms to the shape of treated surface 14. Alternately, in an embodiment, substance 40 may be dispensed upon substrate 20 prior to moving template 12 into a desired position relative to substrate 20.

Substance 40 may form an imprinted layer such as imprinted layer 16 shown in FIGS. 1A and 1B. Preferably, substance 40 may be a liquid so that it may fill the space of gap 31 rather easily and quickly without the use of high temperatures and the gap can be closed without requiring high pressures. Further details regarding appropriate selections for substance 40 are discussed below.

A curing agent 32 may be applied to the template 12 causing substance 40 to harden and assume the shape of the space defined by gap 31. In this way, desired features 44 (FIG. 2D) from the template 12 may be transferred to the upper surface of the substrate 20. Transfer layer 18 may be provided directly on the upper surface of substrate 20. Transfer layer 18 may facilitate the amplification of features transferred from the template 12 to generate high aspect ratio features.

Figure 2D:
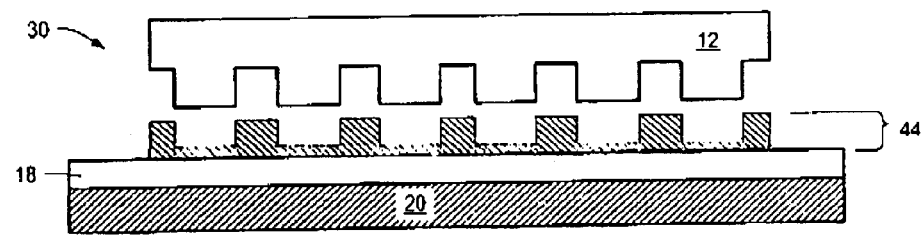

As depicted in FIG. 2D, template 12 may be removed from substrate 20 leaving the desired features 44 thereon. The separation of template 12 from substrate 20 must be done so that desired features 44 remains intact without shearing or tearing from the surface of the substrate 20. Embodiments presented herein provide a method and associated system for peeling and pulling (referred to herein as the "peel-and-pull" method) template 12 from substrate 20 following imprinting so that desired feature 44 remain intact.

Figure 2E:
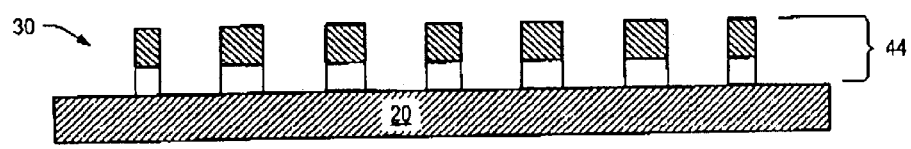
Figure 3:
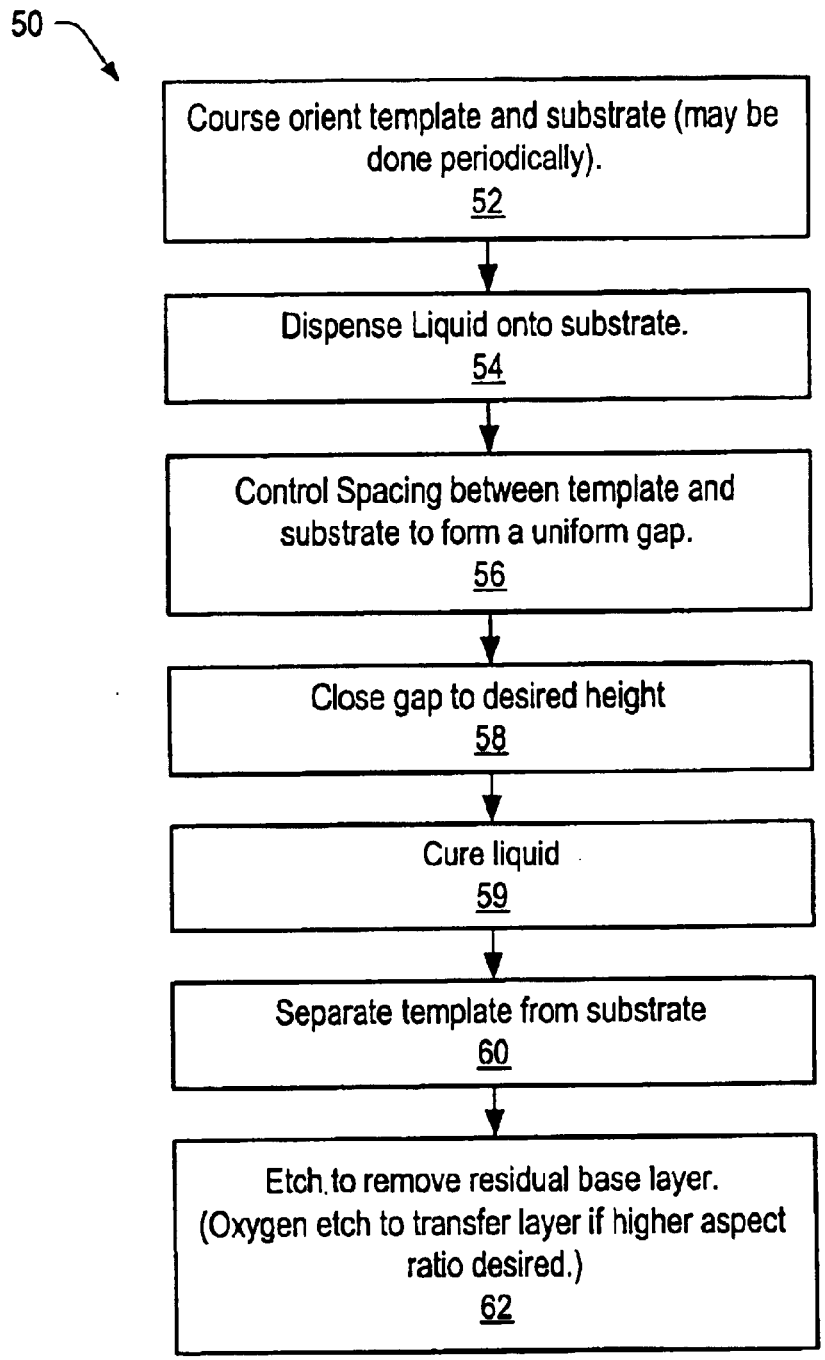
FIG. 3 depicts a process flow chart showing the sequence of steps of the imprint lithography process.

Finally, in FIG. 2E, features 44 transferred from template 12 to substance 40 may be amplified in vertical size by the action of the transfer layer 18 as is known in the use of bilayer resist processes. The resulting structure may be further processed to complete the manufacturing process using well-known techniques. FIG. 3 summarizes an embodiment of an imprint lithography process, denoted generally as 50, in flow chart form. Initially, at step 52, coarse orientation of a template and a substrate may be performed so that a rough alignment of the template and substrate may be achieved. An advantage of coarse orientation at step 52 may be that it may allow pre-calibration in a manufacturing environment, where numerous devices are to be manufactured, with efficiency and with high production yields. For example, where the substrate includes one of many die on a semiconductor wafer, coarse alignment (step 52) may be performed once on the first die and applied to all other dies during a single production run. In this way, production cycle times may be reduced and yields may be increased.

At step 54, a substance may be dispersed onto the substrate. The substance may be a curable organosilicon solution or other organic liquid that may become a solid when exposed to activating light. The fact that a liquid is used may eliminate the need for high temperatures and high pressures associated with prior art lithography techniques. Next, at step 56, the spacing between the template and substrate may be controlled no that, a relatively uniform gap may be created between the two layers permitting the precise orientation required for successful imprinting. Embodiments presented herein provide a device and system for achieving the orientation (both coarse and fine) required at step 56.

At step 58, the gap may be closed with fine vertical motion of the template with respect to the substrate and the substance. The substance may be cured (step 59) resulting in a hardening of the substance into a form having the features of the template. Next, the template may separated from the substrate, step 60, resulting in features from the template being imprinted or transferred onto the substrate. Finally, the structure may be etched, step 62, using a preliminary etch to remove residual material and a well-known oxygen etching technique to etch the transfer layer.

In various embodiments, a template may incorporate unpatterned regions i) in a plane with the template surface, ii) recessed in the template, iii) protrude from the template, or iv) a combination of the above. A template may be manufactured with protrusions, which may be rigid. Such protrusions may provide a uniform spacer layer useful for particle tolerance and optical devices such as gratings, holograms, etc. Alternately, a template may be manufactured with protrusions that are compressible.

In general, a template may have a rigid body supporting it via surface contac from: i) the sides, ii) the back, iii) the front or iv) a combination of the above. The template support may have the advantage of limiting template deformation or distortion under applied pressure. In some embodiments, a template may be coated in some regions with a reflective coating. In some such embodiments, the template may incorporate holes in the reflective coating such that light may pass into or through the template. Such coatings may be useful in locating the template for overlay corrections using interferometry. Such coatings may also allow curing with a curing agent source that illuminates through the sides of the template rather than the top. This may allow flexibility in the desing of a template holder, of gap sensing techniques, and of overlay mark detection systems, among other things. Exposure of the template may be performed: i) at normal incidences to the template, ii) at inclined angles to the template, or iii) through a side surface of the template. In some embodiments, a template that is rigid may be used in combination with a flexible substrate.

The template may be manufactured using optical lithography, electron beam lithography, ion-beam lithography, x-ray lithography, extreme ultraviolet lithography, scanning probe lithography, focused ion beam milling, interferometric lithography, epitaxial growth, thin film deposition, chemical etch, plasma etch, ion milling, reactive ion etch or a combination of the above. The template may be formed on a substrate having a flat, parabolic, spherical, or other surface topography. The template may be used with a substrate having a flat, parabolic, spherical, or other surface topography. The substrate may contain a previously patterned topography and/or a film stack of multiple materials.

Figure 4:
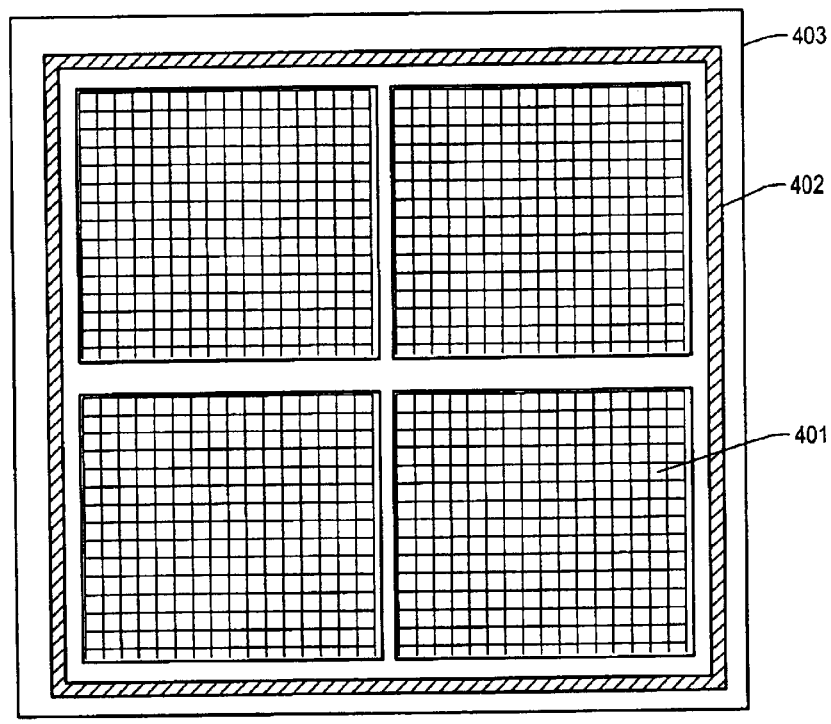
FIG. 4 depicts a bottom view of a patterned template.

In an embodiment depicted in FIG. 4, a template may include a patterning region 401, an entrainment channel 402, and an edge 403. Template edge 403 may be utilized for holding the template within a template holder. Entrainment channel 402 may be configured to entrain excess fluid thereby preventing its spread to adjacent patterning areas, as discussed in more detail below. In some embodiments, a patterned region of a template may be flat. Such embodiments may be useful for planarizing a substrate.

Figure 5:
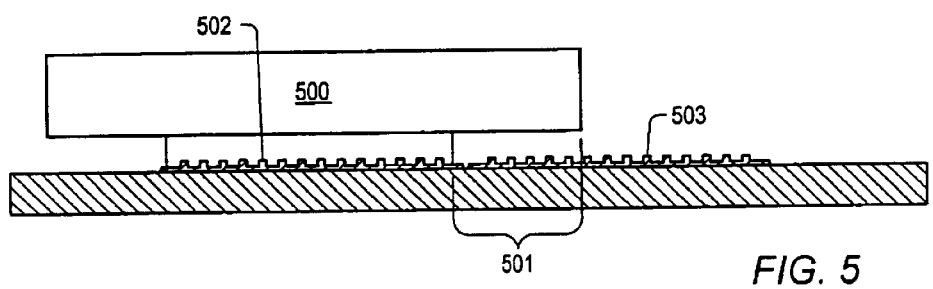
FIG. 5 depicts a cross-sectional view of a template positioned over a substrate.

In some embodiments, the template may be manufactured with a multi-depth design. That is, various features of the template may be at different depths with relation to the surface of the template. For example, entrainment channel 402 may have a depth greater than patterning area 401. An advantage of such an embodiment may be that accuracy in sensing the gap between the template and substrate may be improved. Very small gaps (e.g., less than about 100 nm) may be difficult to sense; therefore, adding a step of a known depth to the template may enable more accurate gap sensing. An advantage of a dual-depth design may be that such a design may enable using a standardized template holder to hold an imprint template of a given size which may include dies of various sizes. A third advantage of a dual-depth design may enable using the peripheral region to hold the template. In such a system, all portions of the template and substrate interface having functional structures may be exposed to the curing agent. As depicted in FIG. 5, a template 500 with the depth of the peripheral region 501 properly designed may abut adjacent imprints 502, 503. Additionally, the peripheral region 501 of imprint template 500 may remain a safe vertical distance away from imprints 503.

Figure 6:
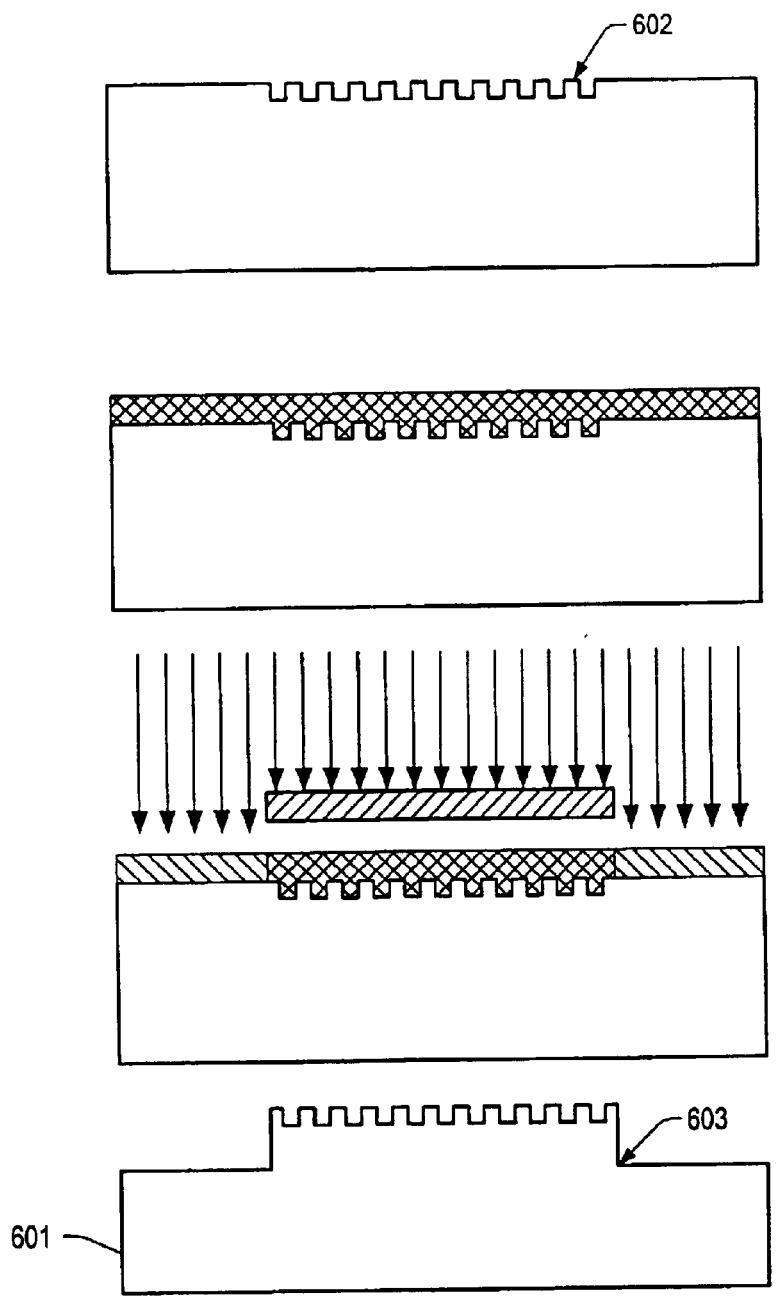
FIG. 6 depicts a cross sectional view of an imprint lithography process using a transfer layer.
Figure 7:
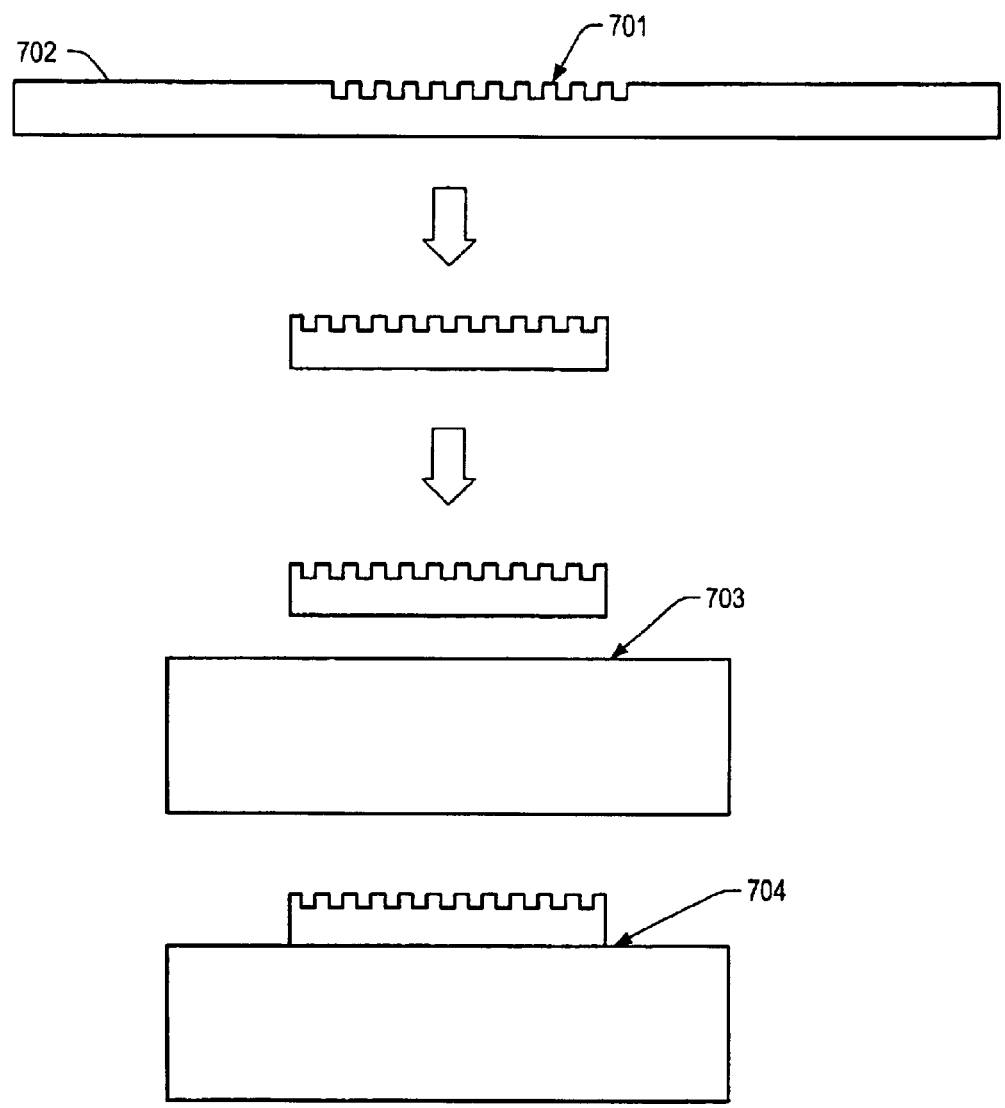
FIG. 7 depicts a cross-sectional view of a process for forming an imprint lithography template.

A dual-depth imprint template, as described above, may be fabricated using various methods. In an embodiment depicted in FIG. 6, a single, thick substrate 601 may be formed with both a high-resolution, shallow-depth die pattern 602, and a low-resolution, large-depth peripheral pattern 603. In an embodiment, as depicted in FIG. 7, a thin substrate 702 (e.g., quartz wafer) may be formed having a high-resolution, shallow-depth die pattern 701. Die pattern 701 may then be cut from substrate 702. Die pattern 701 may then be bonded to a thicker substrate 703, which has been sized to fit into an imprint template holder on an imprint machine. This bonding may be preferably achieved using an adhesive 704 with an index of refraction of the curing agent (e.g., UV light) similar to that of the template material.

Figure 8A:
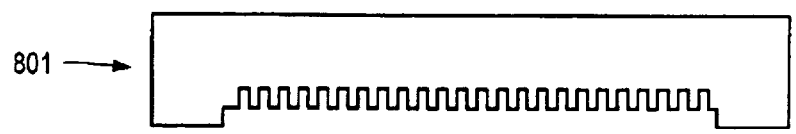
FIGS. 8A–8C depict cross-sectional views of patterned templates.
Figure 8B:
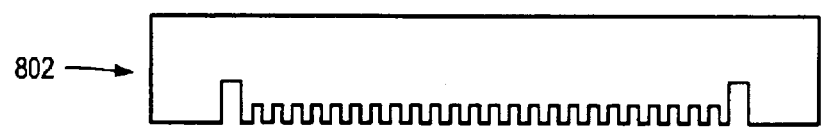
Figure 8C:
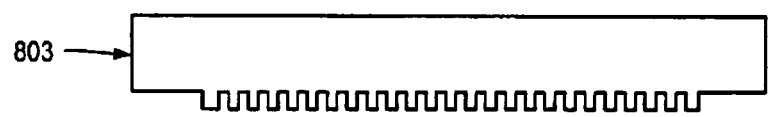

Additional imprint template designs are depicted in FIGS. 8A, 8E, and 8C and generally referenced by numerals 801, 802, and 803, respectively. Each of template designs 801, 802 and 803 may include recessed regions which may be used for gap measurement and or entrainment of excess fluid.

In an embodiment, a template may include a mechanism for controlling fluid spread that is based on the physical properties of the materials as well as geometry of the template. The amount of excess fluid which may be tolerated without causing loss of substrate area may limited by the surface energies of the various materials, the fluid density and template geometry. Accordingly, a relief structure may be used to entrain the excess fluid encompassing a region surrounding the desired molding or patterning area. This region may generally be referred to as the "kerf." The relief structure in the kerf may be recessed into the template surface using standard processing techniques used to construct the pattern or mold relief structure, as discussed above.

Figure 9:
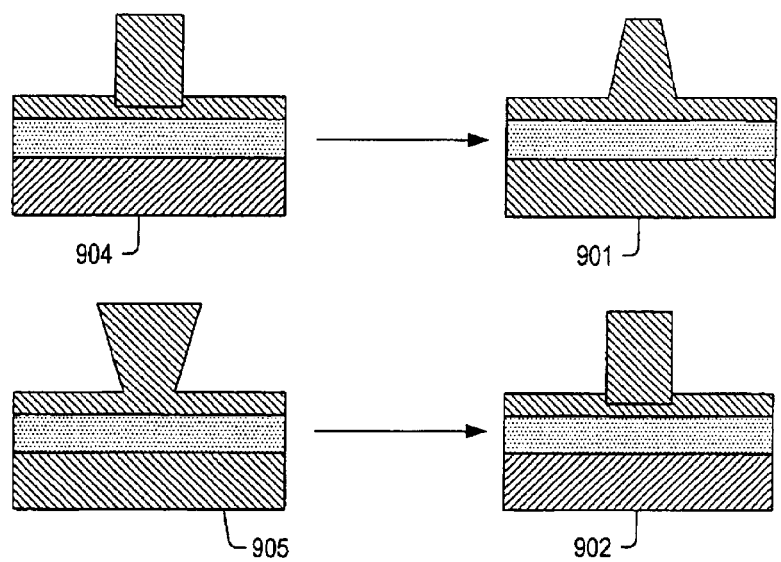
FIG. 9 depicts cross sectional view of alternate patterned template designs.

In conventional photolithography, the use of optical proximity corrections in the photomasks design is becoming the standard to produce accurate patterns of the designed dimensions. Similar concepts may be applied to micro- and nano-molding or imprint lithography. A substantial difference in imprint lithography processes may be that errors may not be due to diffraction or optical interference but rather due to physical property changes that may occur during processing. These changes may determine the nature or the need for engineered relief corrections in the geometry of the template. A template in which a pattern relief structure is designed to accommodate material changes (such as shrinkage or expansion) during imprinting, similar in concept to optical proximity correction used in optical lithography, may eliminate errors due to these changes in physical properties. By accounting for changes in physical properties, such as volumetric expansion or contraction, relief structure may be adjusted to generate the exact desired replicated feature. For example, FIG. 9 depicts an example of an imprint formed without accounting for material property changes 901, and an imprint formed accounting for changes in material properties 502. In certain embodiments, a template with features having a substantially rectangular profile 904, may be subject to deformations due to material shrinkage during curing. To compensate for such material shrinkage, template features may be provided with an angled profile 905.

With respect to imprint lithography processes, the durability of the template and its release characteristics may be of concern. A durable template may be formed of a silicon or silicon dioxide substrate. Other suitable materials may include, but are not limited to: silicon germanium carbon, gallium nitride, silicon germanium, sapphire, gallium arsenide, epitaxial silicon, poly-silicon, gate oxide, quartz or combinations thereof. Templates may also include materials used to form detectable features, such as alignment markings. For example, detectable features may be formed of SiOx, where x is less than 2. In some embodiments x may be about 1.5. It is believed that this material may be opaque to visible light, but transparent to some activating light wavelengths.

It has been found through experimentation that the durability of the template may be improved by treating the template to form a thin layer on the surface of the template. For example, an alkylsilane, a fluoroalkylsilane, or a fluoroalkyltrichlorosilane layer may be formed on the surface, in particular tridecafluoro-1,1,2,2-tetrahydrooctyl trichlorosilane ($C_5F_{13}C_2H_4SiCl_3$) may be used. Such a treatment may form a self-assembled monolayer (SAM) on the surface of the template.

A surface treatment process may be optimized to yield low surface energy coatings. Such a coating may be used in preparing imprint templates for imprint lithography. Treated templates may have desirable release characteristics relative to untreated templates. For example, newly-treated templates may posses surface free energies, $\lambda_{treated}$ of about 14 dynes/cm. Untreated template surfaces may posses surface free energies, $\lambda_{untreated}$ about 65 dynes/cm. A treatment procedure disclosed herein may yield films exhibiting a high level of durability. Durability may be highly desirable since it may lead to a template that may withstand numerous imprints in a manufacturing setting.

A coatings for the template surface may be formed using either a liquid-phase process or a vapor-phase process. In a liquid-phase process, the substrate may be immersed in a solution of precursor and solvent. In a vapor-phase process, a precursor may be delivered via an inert carrier gas. It may be difficult to obtain a purely anhydrous solvent for use in liquid-phase treatments. Water in the bulk phase during treatment may result in clump deposition, which may adversely affect the final quality or coverage of the coating. In an embodiment of a vapor-phase process, the template may be placed in a vacuum chamber, after which the chamber may be cycle-purged to remove excess water. Some adsorbed water may remain on the surface of the template. A small amount of water may be needed to complete a surface reaction which forms the coating. It is believed that the reaction may be described by the formula:

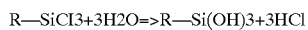

R—SiCl3+3H2O=>R—Si(OH)3+3HCl

To facilitate the reaction, the template may be brought to a desired reaction temperature via a temperature-controlled chuck. The precursor may then be fed into the reaction chamber for a prescribed time. Reaction parameters such as template temperature, precursor concentration, flow geometries, etc. may be tailored to the specific precursor and template substrate combination.

As previously mentioned, substance 40 may be a liquid so that it may fill the space of gap 31. For example, substance 40 may be a low viscosity liquid monomer solution. A suitable solution may have a viscosity ranging from about 0.01 cps to about 100 cps (measured at 25 degrees C.). Low viscosities are especially desirable for high-resolution (e.g., sub-100 nm) structures. In particular, in the sub-50 nm regime, the viscosity of the solution should be at or below about 25 cps, or more preferably below about 5 cps (measured at 25 degrees C.). In an embodiment, a suitable solution may include a mixture of 50% by weight n-butyl acrylate and 50% SIA 0210.0 (3-acryoloxypropyltristrimethylsiloxane) silane. To this solution may be added a small percentage of a polymerization initiator (e.g., a photo initiator). For example, a 3% by weight solution of a 1:1 Irg 819 and Irg 184 and 5% of sm 1402.0 may be suitable. The viscosity of this mixture is about 1 cps.

In an embodiment, an imprint lithography system may include automatic fluid dispensing method and system for dispensing fluid on the surface of a substrate (e.g., a semiconductor wafer). The dispensing method may use a modular automated fluid dispenser with one or more extended dispenser tips. The dispensing method may use an X-Y stage to generate relative lateral motions between the dispenser tip and the substrate. The method may eliminate several problems with imprint lithography using low viscosity fluids. For example, the method may eliminate air bubble trapping and localized deformation of an imprinting area. Embodiments may also provide a way of achieving low imprinting pressures while spreading the fluid across the entire gap between the imprinting template and the substrate, without unnecessary wastage of excess fluid.

In an embodiment, a dispensed volume may typically be less than about 130 nl (nano-liter) for a 1 inch$^2$ imprint area. After dispensing, subsequent processes may involve exposing the template and substrate assembly to a curing agent. Separation of the template from the substrate may leave a transferred image on top of the imprinted surface. The transferred image may lie on a thin layer of remaining, exposed material. The remaining layer may be referred to as a "base layer." The base layer should be thin and uniform for a manufacturable imprint.

Imprint processes may involve high pressures and/or high temperatures applied at the template and substrate interface. However, for the purpose of a manufacturable imprint lithography process including high resolution overlay alignment, high pressures and temperatures should be avoided. Embodiments disclosed herein avoid the need for high temperature by using low viscosity photo-curable fluids. Further, imprinting pressures may be minimized by reducing squeezing force required to spread the fluid across the entire imprinting area. Therefore, for the purpose of fluid based imprint lithography, a fluid dispense process should satisfy the following properties:
1. No air bubble should be trapped between template and substrate;
2. Direct contact between the dispenser tip and substrate should be avoided to minimize particle generation;
3. Pressure required to fill the gap between template and substrate should be minimized;
4. Non-uniform fluid buildup and/or pressure gradients should be minimized to reduce non-uniform localized deformation of template-substrate interface; and
5. Waste of the dispensed fluid should be minimized.

Figure 10A:
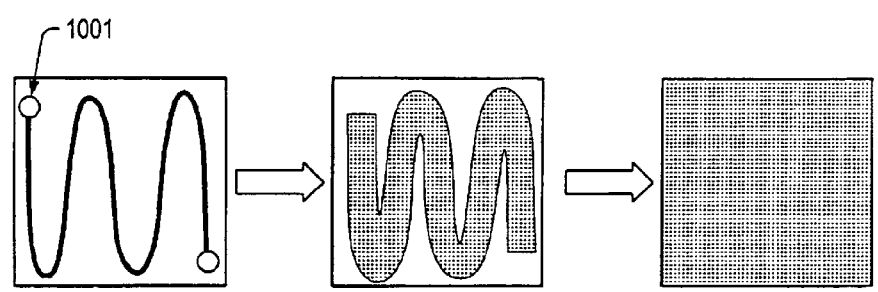
FIGS. 10A–10B depict a top view of a process for applying a curable fluid to a substrate.
Figure 10B:

In some embodiments, relative motion between a displacement based fluid dispenser tip and a substrate may be used to form a pattern with substantially continuous lines on an imprinting area. Size of the cross section of the line and the shape of the line may be controlled by balancing rates of dispensing and relative motion. During the dispensing process, dispenser tips may be fixed near (e.g., on the order of tens of microns) the substrate. Two methods of forming a line pattern are depicted in FIGS. 10A and 10B. The pattern depicted in FIGS. 10A and 10B is a sinusoidal pattern; however, other patterns are possible. As depicted in FIGS. 10A and 10B a continuous line pattern may be drawn using either a single dispenser tip 1001 or multiple dispenser tips 1002.

Dispensing rate, $V_d$, and relative lateral velocity of a substrate, $v_s$, may be related as follows:

$V_d = V_d/t_d$ (dispensing volume/dispensing period), (1)

$V_s = L/t_d$ (line length/dispensing period), (2)

$V_d = aL$ (where, 'a' is the cross section area of line pattern), (3)

Therefore, $V_d = a V_s.$ (4)

Figure 11:
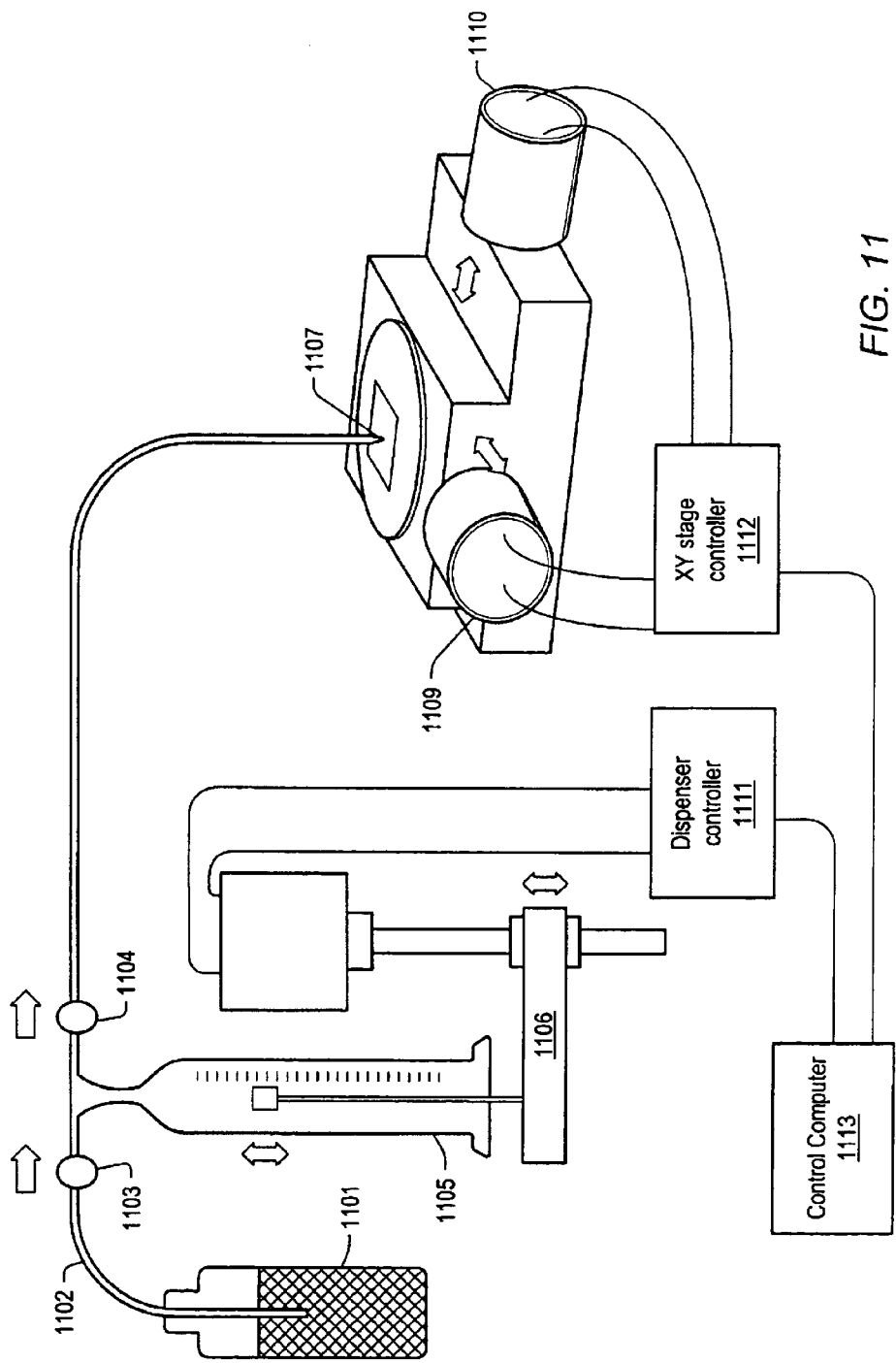
FIG. 11 depicts a schematic of an apparatus for dispensing a fluid during an imprint lithographic process.

The width of the initial line pattern may normally depend on the tip size of a dispenser. The tip dispenser may be fixed. In an embodiment, a fluid dispensing controller 1111 (as depicted in FIG. 11) may be used to control the volume of fluid dispensed ($V_d$) and the time taken to dispense the fluid ($t_d$). If $V_d$ and td are fixed, increasing the length of the line leads to lower height of the cross section of the line pattern. Increasing pattern length may be achieved by increasing the spatial frequency of the periodic patterns. Lower height of the pattern may lead to a decrease in the amount of fluid to be displaced during imprint processes. By using multiple tips connected to the same dispensing line, line patterns with long lengths may be formed faster as compared to the case of a single dispenser tip. In an embodiment, a displacement based fluid delivery system may include: a fluid container 1101, an inlet tube 1102, an inlet valve 1103, an outlet valve 1104, a syringe 1105, a syringe actuator 1106, a dispenser tip 1107, an X stage actuator 1109, a Y stage actuator 1110, a dispenser controller 1111, an XY stage controller 1112, and a main control computer 1113. A suitable displacement based dispenser may be available from the Hamilton Company.

Figure 12:
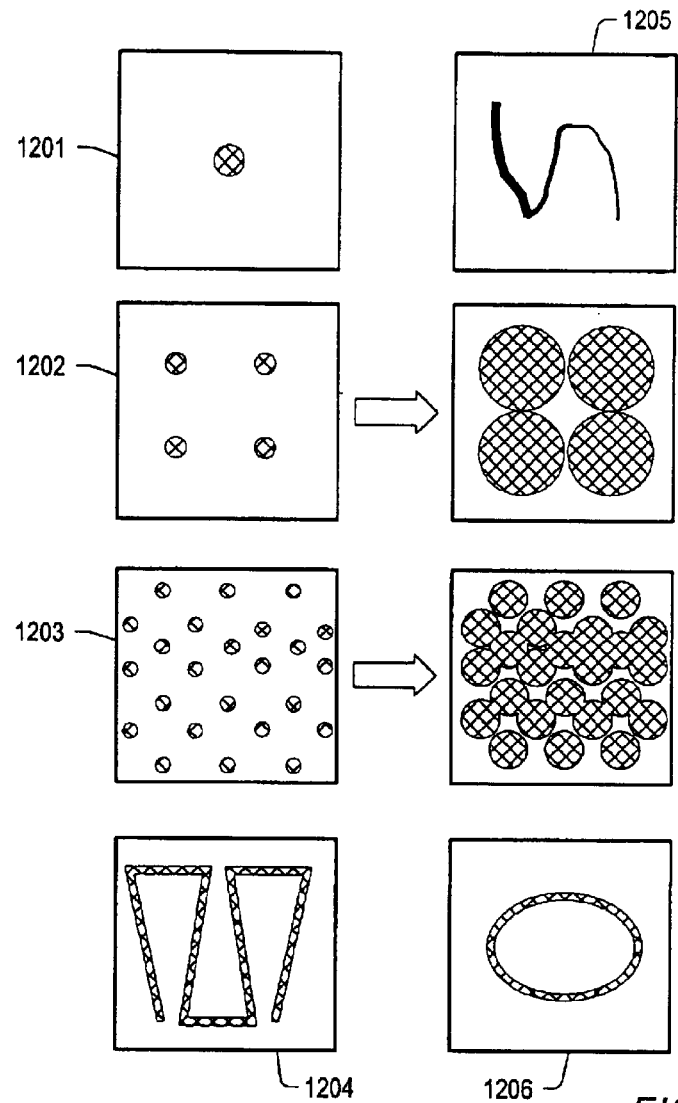
FIG. 12 depicts fluid dispensing patterns used in an imprint lithographic process.

FIG. 12 illustrates several undesirable fluid patterns or dispensing methods for low viscosity fluids. These dispensing patterns may lead to one or more problems, including: trapping air bubbles, localized deformations, and waste of fluid. For example, dispensing a single drop at the center of the imprinting area 1201, or dispensing irregular lines 1205 may lead to localized deformations of the template and/or substrate. Dispensing several drops 1202, or lines 1206 in a circumferential pattern may lead to trapping of air bubbles. Other dispensing patterns with nearly closed circumferential patterns 1204 may similarly lead to air bubble trapping. Likewise, spraying or random placement of droplets 1203 may lead to trapping of air bubbles. Spin-coating a substrate with a low viscosity fluid may cause a "dewetting" problem due to the thin film instability. Dewetting may lead to formation of numerous small drops of fluid on the substrate, instead of a thin uniform layer of fluid.

Figure 13:
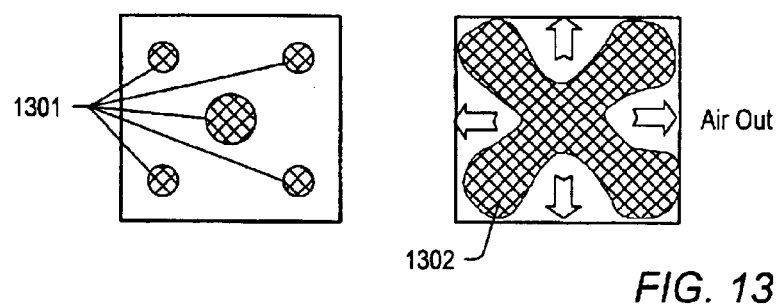
FIG. 13 depicts a fluid pattern that includes a plurality of drops on a substrate.

In an embodiment, a fluid dispensing method may dispense multiple small drops of liquid that may later be formed into a continuous body as they expand. FIG. 13 depicts the case of using five drops of liquid. Here, five drops are used only for the purpose of illustration. Other "open" patterns, such as a sinusoidal line, a 'W', or an 'X' may be implemented using this method. As the template-substrate gap decreases, circular drops 1301 may become thinner and wider causing neighboring drops to merge together 1302. Therefore, even though the initial dispensing may not include a continuous form, the expanding liquid may expel air from the gap between the template and substrate. A pattern effective for use in this method should be dispensed in such a way that as droplets expand, they do not trap any air between the template and substrate.

Figure 14:
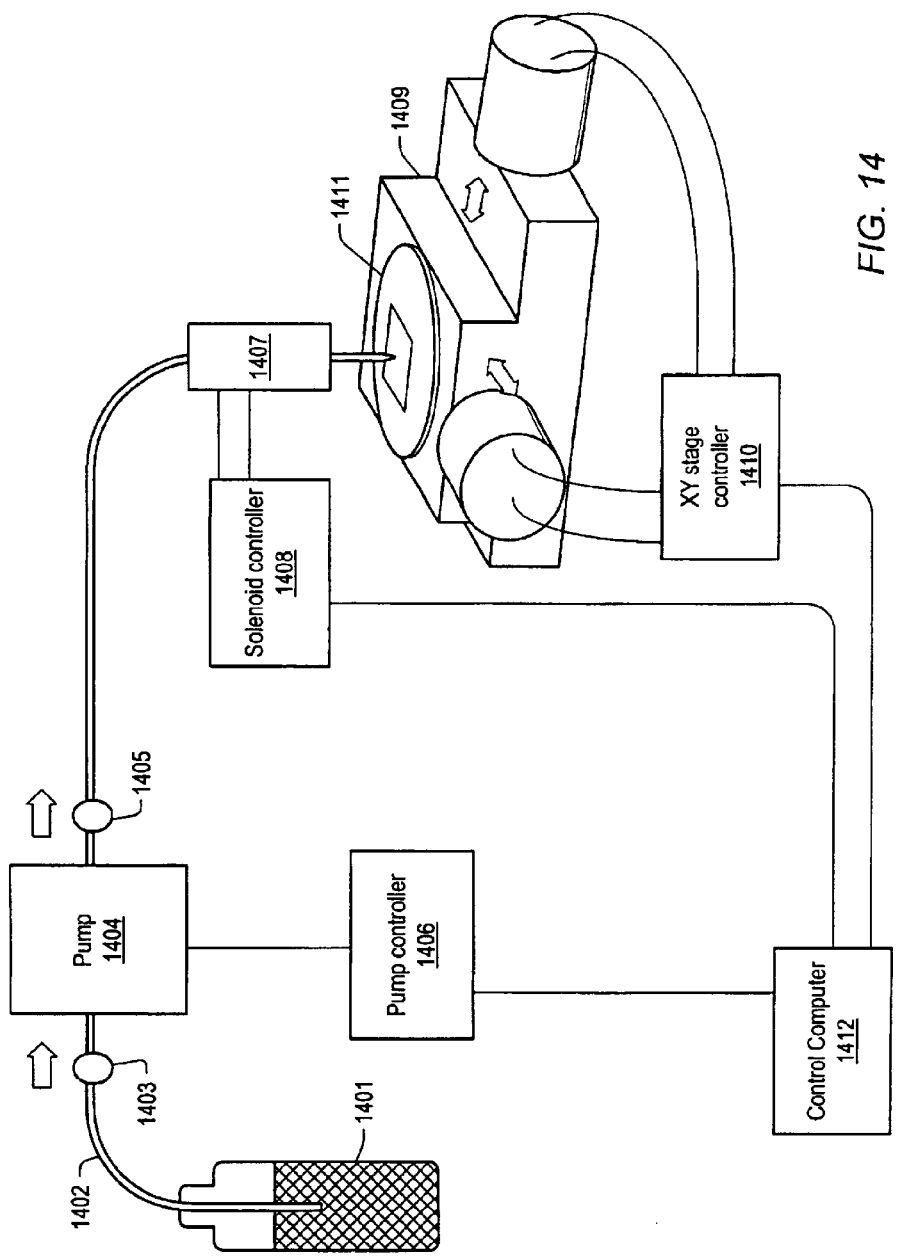
FIG. 14 depicts a schematic of an alternate apparatus for dispensing a fluid during an imprint lithographic process.

Small drops of liquid whose volume may be accurately specified may be dispensed using micro-selenoid valves with a pressure-supporting unit. Another type of the liquid dispensing actuator may include a piezo-actuated dispenser. Advantages of a system with a micro-solenoid valve dispenser as compared to a displacement based fluid dispenser may include faster dispensing time and more accurate volume control. These advantages may be especially desirable for larger size imprints (e.g., several inches across). An embodiment of a system including micro-solenoid valves is depicted in FIG. 14. The system may include: fluid container 1401, an inlet tube 1402, an inlet valve 1403, a pump 1404, an outlet valve 1405, a pump controller 1406, a micro-solenoid valve 1407, a micro-solenoid valve controller 1408, an X-y stage 1409, an X-Y stage controller 1410, and a main computer 1412. A substrate 1411 may be placed on X-Y stage 1409. A suitable micro-solenoid valve dispenser system may be available from the Lee Company.

Figure 15A:
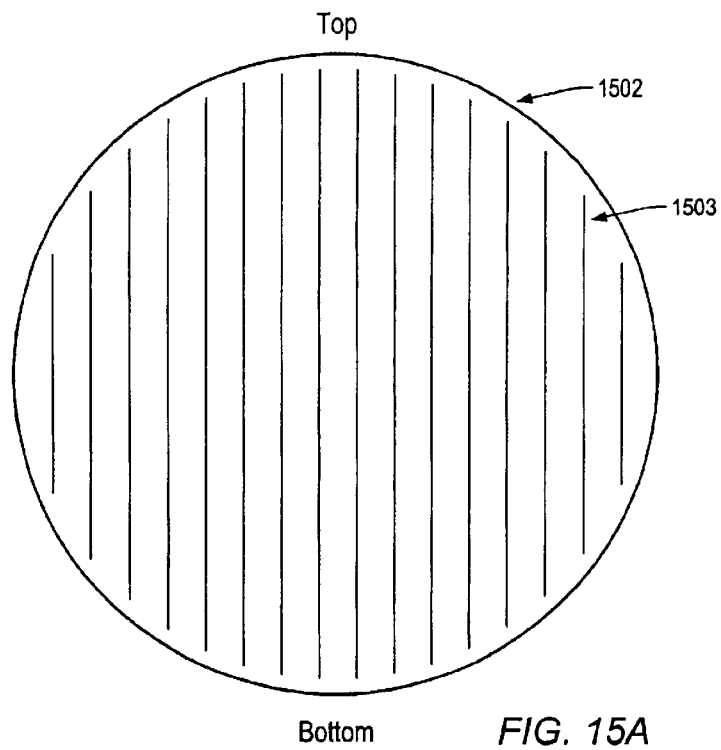
FIGS. 15A–15B depict a fluid pattern that includes a plurality of substantially parallel lines.
Figure 15B:
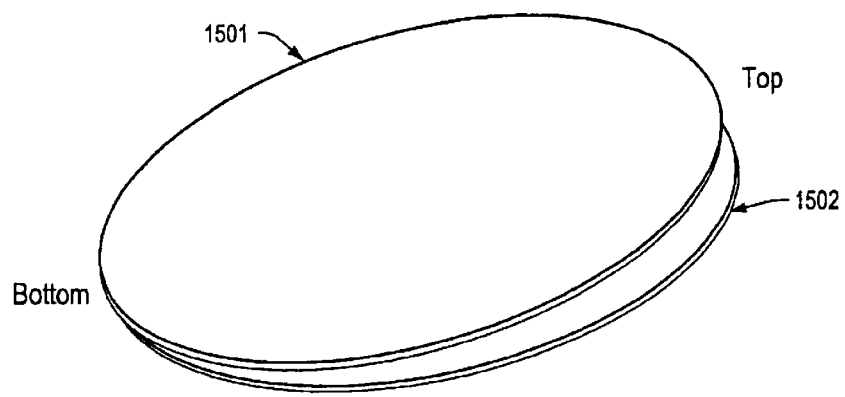

A dispensing pattern that may be useful for large imprint areas (e.g., greater than several inches$^2$) is depicted in FIG. 15A. In such an embodiment, parallel lines of fluid 1503 may be dispensed. Parallel lines of fluid 1503 may be expanded in such a way that air may be expelled from the gap as template 1501 approaches substrate 1502. To facilitate expanding lines 1503 in the desired manner, template 1501 may be close to the gap in an intentionally wedged configuration (as depicted in FIG. 15B). That is, the template/substrate gap may be closed along lines 1503 (e.g., the wedge angle may be parallel to the lines 1503).

An advantage of providing a well-distributed initial fluid layer may be that the orientation error between the template and substrate may be compensated for. This may be due to the hydraulic dynamics of the thin layer of fluid and compliance of the orientation stage. The lower portion of the template may contact the dispensed fluid earlier than other portions of the template. As the gap between the template and substrate gets smaller, the imbalance of reaction forces between the lower and higher portions of the template increases. This imbalance of forces may lead to a correcting motion for the template and substrate, e.g., bring them into a substantially parallel relationship.

Successful imprint lithography may require precise alignment and orientation of the template with respect to the substrate to control the gap in between the template and substrate. Embodiments presented herein may provide a system capable of achieving precise alignment and gap control in a production fabrication process. In an embodiment, the system may include a high resolution X-Y translation Stage. In an embodiment, the system may provide a pre-calibration stage for performing a preliminary and coarse alignment operation between the template and substrate surface to bring the relative alignment to within the motion range of a fine movement orientation stage. This pre-calibration stage may be required only when a new template is installed into the apparatus (also sometimes known as a stepper). The pre-calibration stage may consist of a base plate, a flexure component, and a plurality of micrometers or high resolution actuators coupling the base plate and the flexure component.

FIG. 16 depicts an embodiment of an X-Y translation stage in an assembled configuration, and generally referenced by numeral 1600. The overall footprint may be less than about 20 inches by 20 inches and the height may be about 6 inches (including a wafer chuck). Such an embodiment may provide X and Y-axis translation ranges of motion of about 12 inches.

Figure 17:
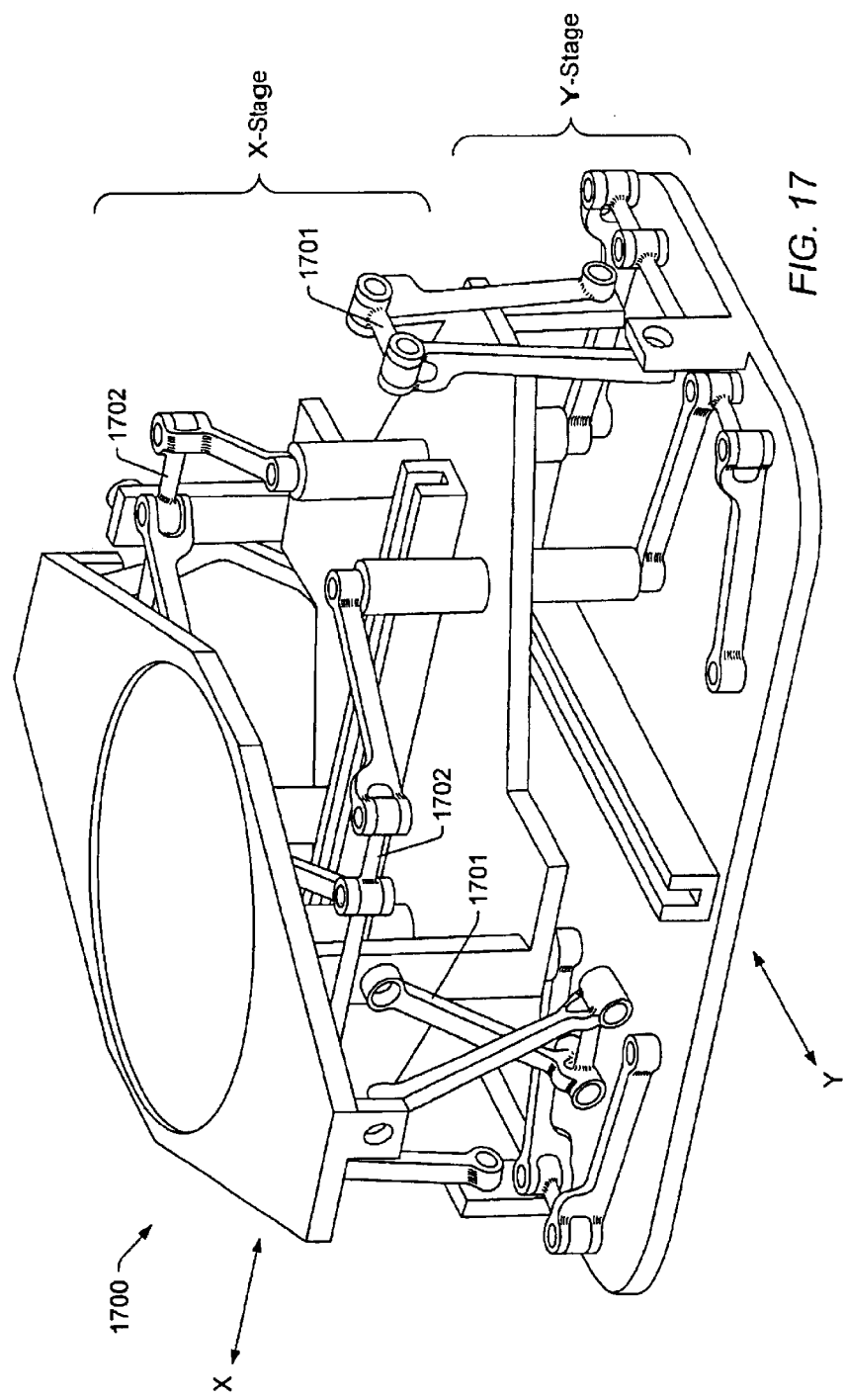
FIG. 17 depicts a projection view of an alternate substrate support system.

A second embodiment of an X-Y translation stage is depicted in FIG. 17, and generally referenced by numeral 1700. To provide a similar range of motion to that of X-Y stage 1600, stage 1700 may have a foot print of about 29 inches by 29 inches and a height of about 15 inches (including a wafer chuck). Stages 1600 and 1700 differ mainly in that additional linkages 1701 are oriented vertically, thereby providing additional load bearing support for the translation stage.

Both X-Y stage 1600 and X-Y stage 1700 are flexure based systems. Flexures are widely used in precision machines since they may offer frictionless, particle-free and low maintenance operation. Flexures may also provide extremely high resolution. However, most flexure based systems may possess limited ranges of motion (e.g., sub mm range of motion). Embodiments disclosed herein may have a range of motion of more than 12 inches. It is believed that such stages may be cost-effective for lithographic applications, particularly in vacuum. Further, for imprint lithography techniques, the presence of imprint forces may give embodiments presented herein significant advantages.

In general, an X-Y stage may include two types of components: actuation components and load-carrying components. Lead screw assembly mechanisms have been widely used where the positioning accuracy is not a very significant factor. For high accuracy applications, ball screw assemblies have been used for both the actuating and load-carrying components. Both of these designs may be prone to problems of backlash and stiction. Further, the need for lubrication may make these designs undesirable for use in vacuum or in particle-sensitive applications (e.g., imprint lithography).

Additionally, some designs may utilize air bearings. Air bearings may substantially eliminate problems of stiction and backlash. However, air bearings may provide limited load bearing capacities. Additionally, air bearings may be unsuitable for use in vacuum environments.

Figure 18:
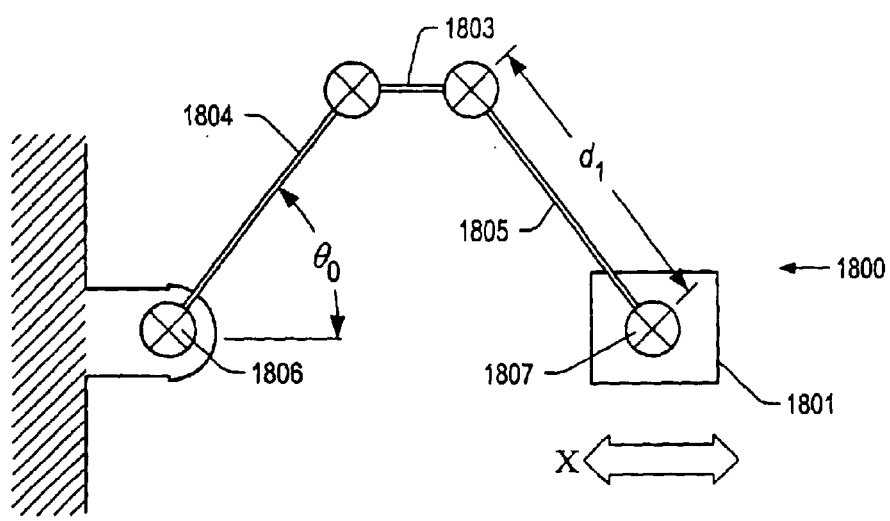
FIG. 18 is a schematic diagram of a 4-bar linkage illustrating motion of the flexure joints.

FIG. 18 shows a schematic of portion of a basic linkage 1800. Link 1 (1804) and link 3 (1805) may be of the same length. When a moving body 1801 moves along the X-axis, all of the joints in linkage 1800 rotate by the same absolute angle. It should be noted that the motion range may be independent of the length of link 2 (1803). Due to kinematic constraints, link 2 (1803) may remain parallel to a line between joint 1 (1806) and joint 4 (1807). In linkage 1800, the range of motion, lm, may be given as:

$$l_m = 2d_1 [\cos(\theta_0 - \alpha_{max}/2) - \cos(\theta_0 + \alpha_{max}/2)] \quad (5)$$
$$= 4d_1 \sin(\theta_0)\sin(\alpha_{max}/2),$$

where, $\theta_o$ is the angle of joint 1 (1806) when all flexure joints are in their equilibrium conditions, $\alpha_{max}$ is the maximum rotation range of the flexure pivots, and $d_1$ is the length of links 1 and 3, (1804) and (1805). As shown in Eqn. (5), for given $d_1$, the motion range is maximized when $\theta_o$=90 Degree. Therefore, the link length may be given as:

$$d_1 = l_m/[4\sin(\alpha_{max}/2)] \quad (6)$$

Therefore, using an $\alpha_{max}$ of 60°, the minimum link length for a 12 inch motion range, is 6 inches.

Figure 19:
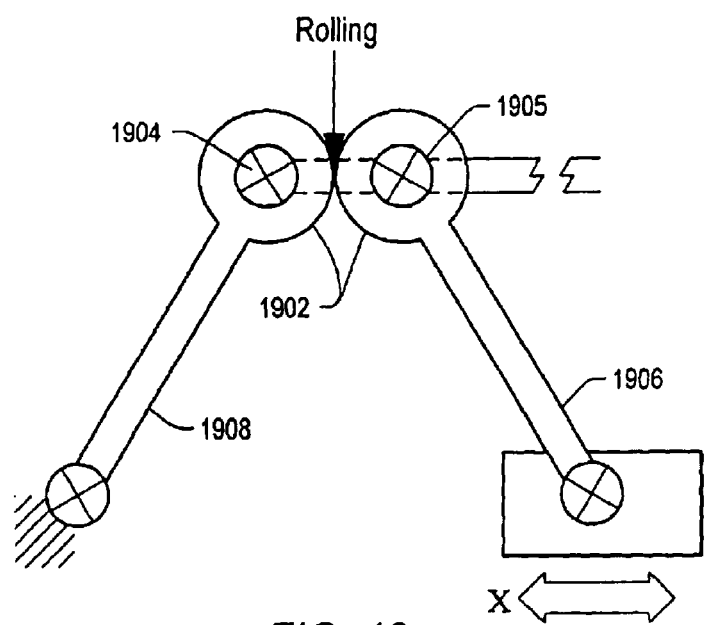
FIG. 19 is a schematic diagram of a 4-bar linkage illustrating alternate motion of the flexure joints.

FIG. 19 depicts an embodiment of a basic linkage similar to linkage 1800, but with the addition of two cylindrical disks 1902. A kinematic study shows that if joint 2 1904 and joint 3 1905 of FIG. 19 rotate in opposite directions by the same angle, the stage may generate a pure translational motion along the X axis. By adding cylindrical disks 1902 at flexure joints 2 1904 and 3 1905, the resulting rolling contact may rotate link 1 1908 and link 2 1906 in opposite directions. In an embodiment, no additional joints or bearings may be required since cylindrical discs 1902 may be coupled to links 1908 and 1906. In order to prevent discs 1902 from slipping, an appropriate pre-load may be applied between the two disks. Compared to conventional stages where direct driven mechanisms or bearings may be used, the contact surface here may be relatively small, and relatively easy to maintain. Note that although disks 1902 are not depicted in relation to X-Y stages 1600, and 1700, disks 1902 may be present in some embodiments. Links 1602 and 1601 in FIG. 16 may correspond to links 1908 and 1906 of FIG. 19. Thus disks 1902 may be present at location 1603 (as well as other locations not visible in the FIG. 16). Referring to FIG. 17, disks 1902 may be present at location 1702 (as well as other locations not visible in FIG. 17).

Figure 20:
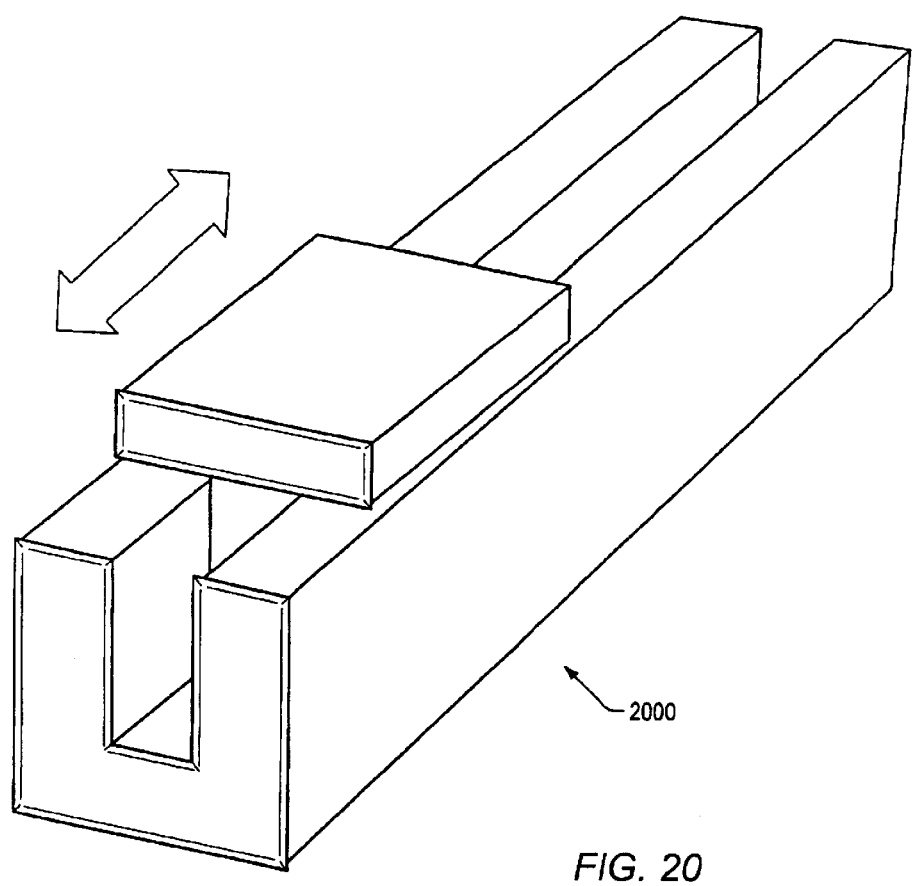
FIG. 20 is a projection view of a magnetic linear servo motor.

As the actuation system for either of stages 1600 or 1700, two linear servo motors (as depicted in FIG. 20 and referenced by numeral 2000) may be suitable. One linear servo motor may serve each translation axis. Suitable linear servo motors may be available from the Trilogy Systems Corporation. An advantage of such linear servo motors may be the absence of frictional contact. Another advantage of such linear servo motors may be the fact that they may readily produces actuation forces greater than about 100 pounds. Therefore, actuation components may provide only translational motion control in the X and Y directions. It should be noted that in some embodiments, the actuator of the lower stage might need to be more powerful than the actuator of the upper stage. In some embodiments, laser interferometers may provide a feedback signal to control X and Y positioning of the X-Y stage. It is believed that laser interferometry may provide nm level positioning control.

Figure 21:
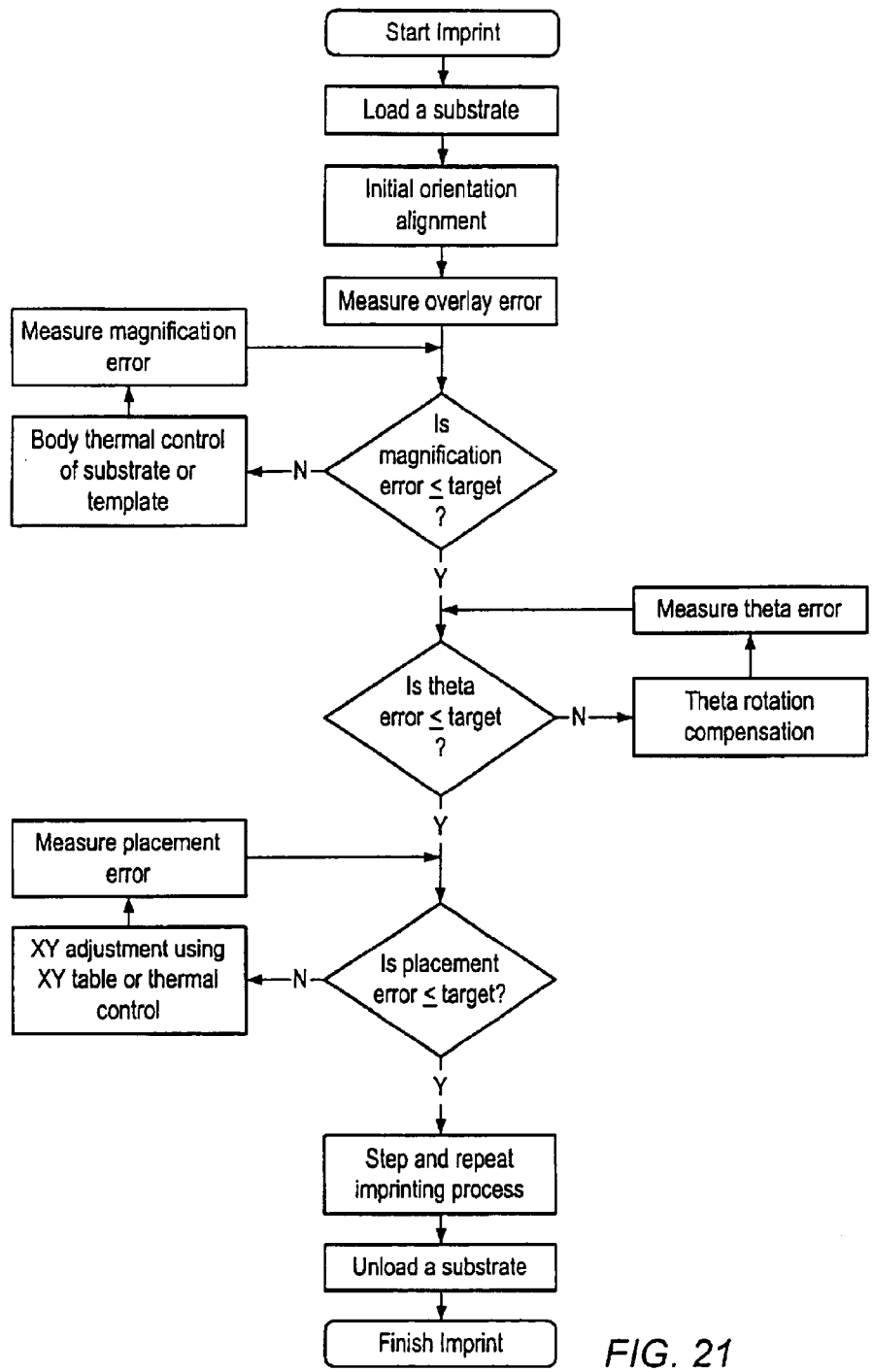
FIG. 21 is a process flow chart of global processing of multiple imprints.
Figure 22:
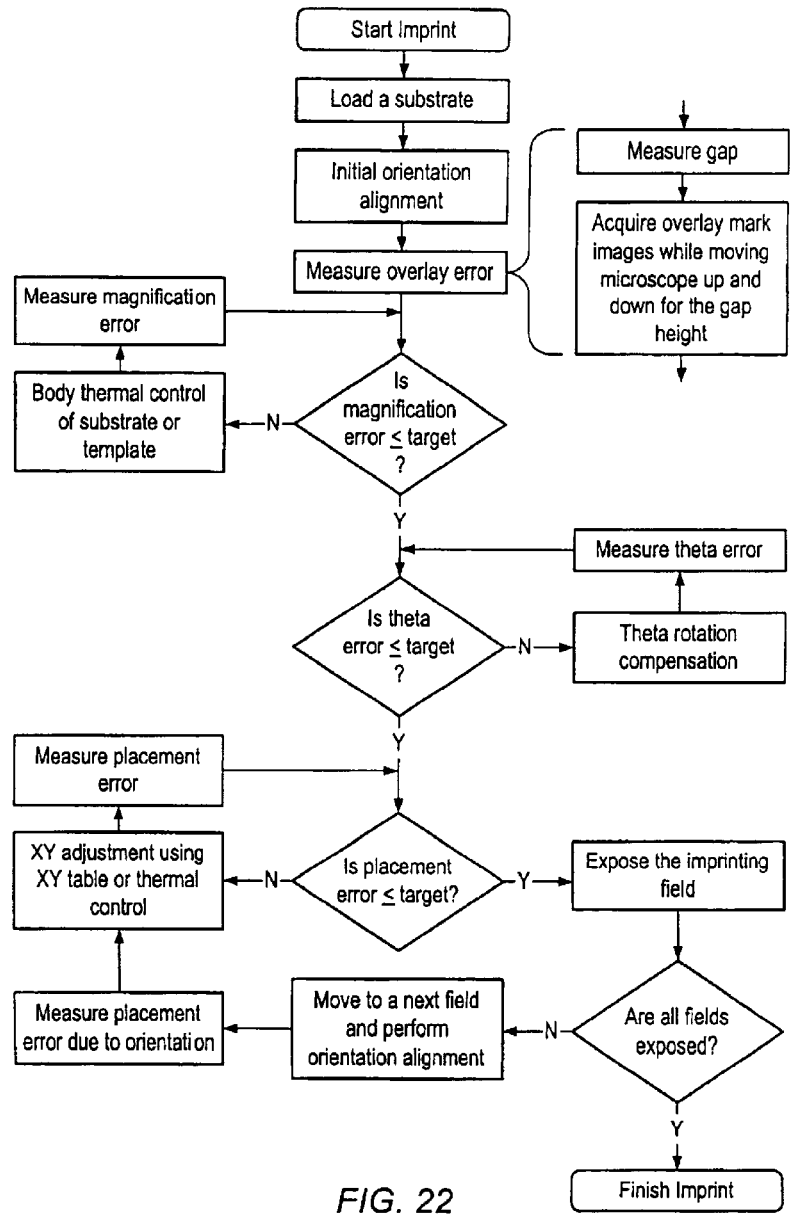
FIG. 22 is a process flow chart of local processing of multiple imprints.

Placement errors can be compensated using laser interferometers and high resolution X-Y stages (such as X-Y stage 1700, depicted in FIG. 17). If the orientation alignments between the template and substrate arc independent from X-Y motions, the placement error may need to be compensated only once for an entire substrate wafer (i.e., "global overlay"). If orientation alignments between the template and substrate are coupled with X-Y motions and/or excessive local orientation variations on the substrate exist, then X-Y position changes of the template relative to the substrate may need to be compensated for (i.e., field to-field overlay). Overlay alignment issues are further discussed with regard the overlay alignment section. FIGS. 21 and 22 provide global and field-to-field overlay error compensation algorithms, respectively.

In an embodiment, orientation of template and substrate may be achieved by a pre-calibration stage (automatically, using actuators or manually, using micrometers) and a fine orientation stage, which may be active or passive. Either or both of these stages may include other mechanisms, but flexure-based mechanisms may be preferred in order to avoid particles. The calibration stage may be mounted to a frame, and the fine orientation stage may be mounted to the pre-calibration stage. Such an embodiment may thereby form a serial mechanical arrangement.

A fine orientation stage may include one or more passive compliant members. A "passive compliant member" may generally refer to a member that gets its motion from compliance. That is, motion may be activated by direct or indirect contact with the liquid. If the fine orientation stage is passive, then it may be designed to have the most dominant compliance about two orientation axes. The two orientation axes may be orthogonal and may lie on the template lower surface as described with reference to FIG. 43). The two orthogonal torsional compliance values may typically be the same for a square template. The fine orientation stage may be designed such that when the template is non-parallel with respect to the substrate, as it makes contact with the liquid, the resulting uneven liquid pressure may rapidly correct the orientation error. In an embodiment, the correction may be affected with minimal, or no overshoot. Further, a fine orientation stage as described above may hold the substantially parallel orientation between the template and substrate for a sufficiently long period to allow curing of the liquid.

In an embodiment, a fine orientation stage may include one or more actuators. For example, piezo actuators (as described with reference to FIG. 46) may be suitable. In such an embodiment, the effective passive compliance of the fine orientation stage coupled with the pre-calibration stage should still be substantially torsional about the two orientation axes. The geometric and material parameters of all the structural and active elements together may contribute to this effective passive stiffness. For instance, piezo actuators may also be compliant in tension and compression. The geometric and material parameters may be synthesized to obtain the desired torsional compliance about the two orthogonal orientation axes. A simple approach to this synthesis may be to make the compliance of the actuators along their actuation direction in the fine orientation stage higher than the structural compliances in the rest of the stage system. This may provide passive self-correction capability when a non-parallel template comes into contact with the liquid on the substrate. Further, this compliance should be chosen to allow for rapidly correcting orientation errors, with minimal or no overshoot. The fine orientation stage may hold the substantially parallel orientation between the template and substrate for sufficiently long period to allow curing of the liquid.

Overlay alignment schemes may include measurement of alignment errors followed by compensation of these errors to achieve accurate alignment of an imprint template, and a desired imprint location on a substrate. The measurement techniques used in proximity lithography, x-ray lithography, and photolithography (e.g., laser interferometry, capacitance sensing, automated image processing of overlay marks on the mask and substrate, etc) may be adapted for the imprint lithography process with appropriate modifications.

Types of overlay errors for lithography processes may include placement error, theta error, magnification error, and mask distortion error. An advantage of embodiments disclosed herein may be that mask distortion errors may not be present because the disclosed processes may operate at relatively low temperatures (e.g., room temperature) and low pressures. Therefore, these embodiments may not induce significant distortion. Further, these embodiments may use templates that are made of a relatively thick substrate. This may lead to much smaller mask (or template) distortion errors as compared to other lithography processes where masks are made of relatively thin substrates. Further, the entire area of the templates for imprint lithography processes may be transparent to the curing agent (e.g., UV light), which may minimize heating due to absorption of energy from the curing agent. The reduced heating may minimize the occurrence of heat-induced distortions compared to photolithography processes where a significant portion of the bottom surface of a mask may be opaque due to the presence of a metallic coating.

Placement error may generally refer to X-Y positioning errors between a template and substrate (that is, translation along the X and/or Y-axis). Theta error may generally refer to the relative orientation error about Z-axis (that is, rotation about the Z-axis). Magnification error may generally refer to thermal or material induced shrinkage or expansion of the imprinted area as compared to the original patterned area on the template.

Figure 23:
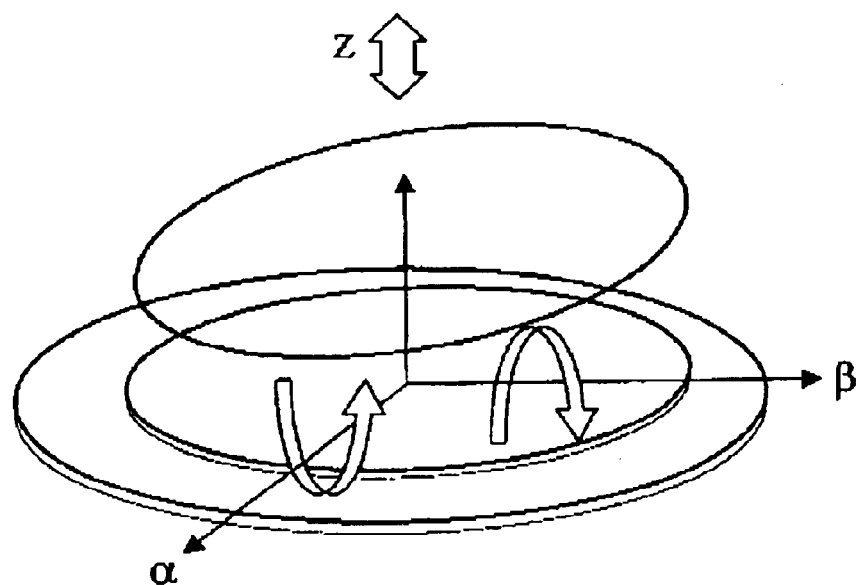
FIG. 23 is a projection view of the axis of rotation of a template with respect to a substrate.

In imprint lithography processes, orientation alignment for gap control purposes between a template and substrate corresponding to the angles α and β in FIG. 23 may need to be performed frequently if excessive field-to-field surface variations exist on the substrate. In general, it is desirable for the variation across an imprinting area to be smaller than about one-half of the imprinted feature height. If orientation alignments are coupled with the X-Y positioning of the template and substrate, field to-field placement error compensations may be necessary. However, embodiments of orientation stages that may perform orientation alignment without inducing placement errors are presented herein.

Photolithography processes that use a focusing lens system may position the mask and substrate such that it may be possible to locate the images of two alignment marks (one on the mask and the other on the substrate) onto the same focal plane. Alignment errors may be induced by looking at the relative positioning of these alignment marks. In imprint lithography processes, the template and substrate maintain a relatively small gap (of the order of micro meters or less) during the overlay error measurement. Therefore, overlay error measurement tools may need to focus two overlay marks from different planes onto the same focal plane. Such a requirement may not be critical for devices with features that are relatively large (e.g., about 0.05–1.0μm). However, for critical features in the sub-100 nm region, the images of the two overlay marks should to be captured on the same focal plane in order to achieve high resolution overlay error measurements.

Accordingly, overlay error measurement and error compensation methods for imprint lithography processes should satisfy the following requirements:

1. Overlay error measurement tools should be able to focus on two overlay marks that are not on the same plane;
2. Overlay error correction tools should be able to move the template and substrate relatively in X and Y in the presence of a thin layer of fluid between the template and substrate;
3. Overlay error correction tools should be able to compensate for theta error in the presence of a thin layer of fluid between the template and substrate; and
4. Overlay error correction tools should be able to compensate for magnification error.

The first requirement presented above can be satisfied by i) moving an optical imaging tool up and down (as in U.S. Pat. No. 5,204,739) or ii) using illumination sources with two different wavelengths. For both these approaches, knowledge of the gap measurement between the template and the substrate is useful, especially for the second method. The gap between the template and substrate may be measured using one of existing non-contact film thickness measurement tools including broad-band interferometry, laser interferometry and capacitance sensors.

Figure 24:
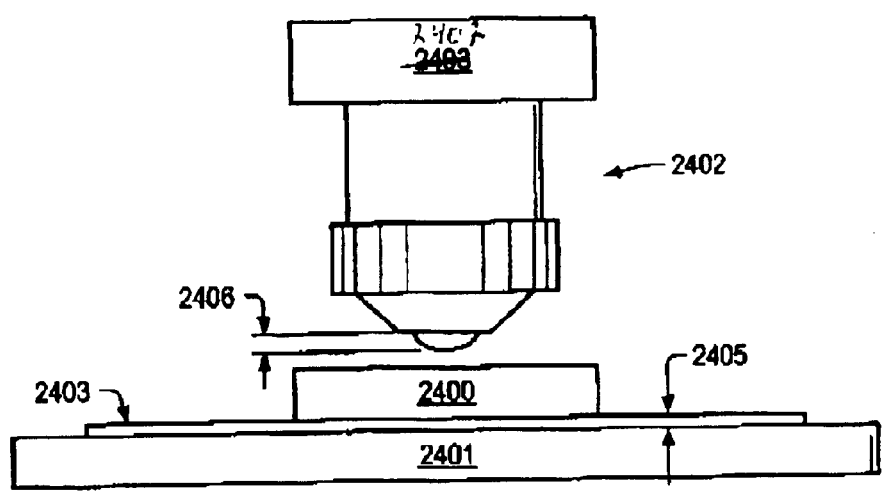
FIG. 24 depicts a measuring device positioned over a patterned template.

FIG. 24 illustrates the positions of template 2400, substrate 2401, fluid 2403, gap 2405 and overlay error measurement tools 2402. The height of a measuring tool may be adjusted 2406 according to the gap information to acquire two overlay marks on the same imaging plane. In order to fulfill this approach an image storing 2407 device may be required. Additionally, the positioning devices of the template and wafer should be vibrationally isolated from the up and down motions of the measuring device 2402. Further, when scanning motions in X-Y directions between the template and substrate are needed for high resolution overlay alignment, this approach may not produce continuous images of the overlay marks. Therefore, this approach may be adapted for relatively low-resolution overlay alignment schemes for the imprint lithography process.

Figure 25:
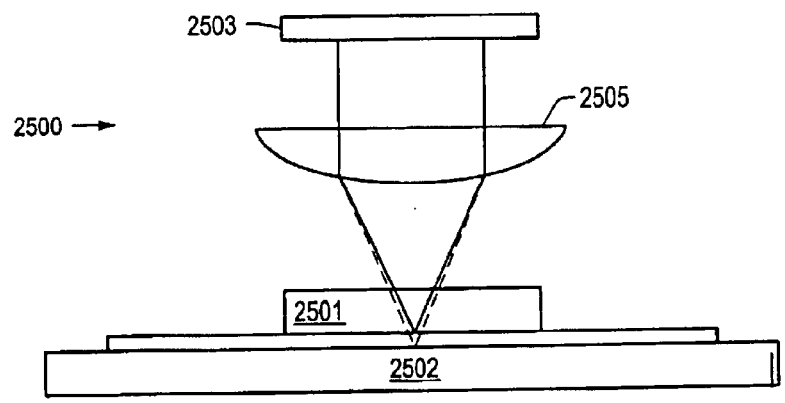
FIG. 25 depicts a schematic of an optical alignment measuring device.
Figure 26:
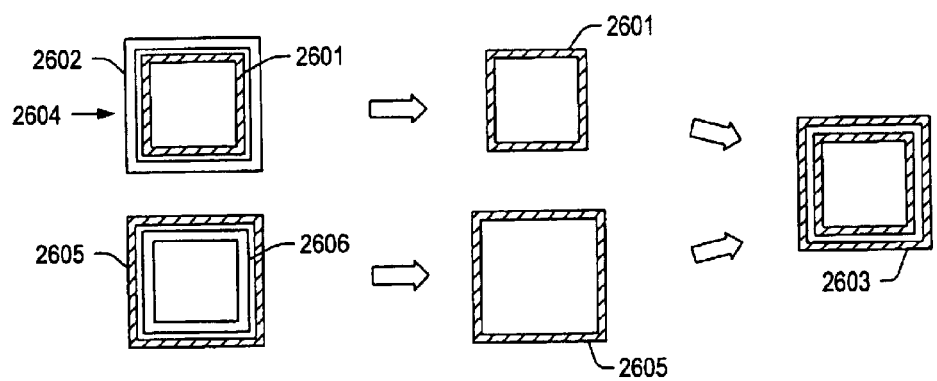
FIG. 26 depicts a scheme for determining the alignment of a template with respect to a substrate using alignment marks.

FIG. 25 illustrates an apparatus for focusing two alignment marks from different planes onto a single focal plane. Apparatus 2500 may use the change of focal length resulting from light with distinct wavelengths being used as the illumination sources. Apparatus 2500 may include an image storage device 2503, and illumination source (not shown), and a focusing device 2505. Light with distinct wavelengths may be generated either by using individual light sources or by using a single broad band light source and inserting optical band-pass filters between the imaging plane and the alignment marks. Depending on the gap between the template 2501 and substrate 2502, a different set of two wavelengths may be selected to adjust the focal lengths. Under each illumination, each overlay mark may produce two images on the imaging plane as depicted in FIG. 26. A first image 2601 may be a clearly focused image. A second image 2602 may be an out-of-focus image. In order to eliminate each out-of-focus image, several methods may be used.

In a first method, under illumination with a first wavelength of light, two images may be received by an imaging array (e.g., a CCD array). Images which may be received are depicted in FIG. 26 and generally referenced by numeral 2604. Image 2602 may correspond to an overlay alignment mark on the substrate. Image 2601 may correspond to an overlay alignment mark on the template. When image 2602 is focused, image 2601 may be out-of-focus, and visa-versa. In an embodiment, an image processing technique may be used to erase geometric data corresponding to pixels associated with image 2602. Thus, the out of focus image of the substrate mark may be eliminated, leaving image 2601. Using the same procedure and a second wavelength of light, image 2605 and 2606 may be formed on the imaging array. The procedure may eliminate out of focus image 2606. Thus image 2605 may remain. The two remaining focused images 2601 and 2605 may then be combined onto a single imaging plane 2603 for making overlay error measurements.

Figure 27:
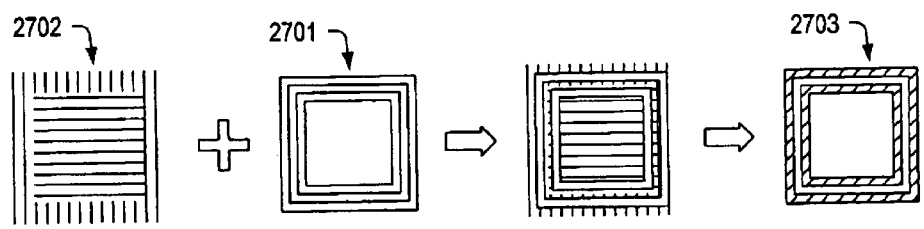
FIG. 27 depicts a scheme for determining the alignment of a template with respect to a substrate using alignment marks using polarized filters.

A second method may utilize two coplanar polarizing arrays, as depicted in FIG. 27, and polarized illumination sources. FIG. 27 illustrates overlay marks 2701 and orthogonally polarized arrays 2702. Polarizing arrays 2702 may be made on the template surface or may be placed above it. Under two polarized illumination sources, only focused images 2703 (each corresponding to a distinct wavelength and polarization) may appear on the imaging plane. Thus, out of focus images may be filtered out by polarizing arrays 2702. An advantage of this method may be that it may not require an image processing technique to eliminate out-of-focused images.

It should be noted that, if the gap between the template and substrate is too small during overlay measurement, error correction may become difficult due to stiction or increased shear forces of the thin fluid layer. Additionally, overlay errors may be caused by the non-ideal vertical motion between the template and substrate if the gap is too large. Therefore, an optimal gap between the template and substrate should to be determined, where the overlay error measurements and corrections may be performed.

Moiré pattern based overlay measurement has been used for optical lithography processes. For imprint lithography processes, where two layers of Moiré patterns are not on the same plane but still overlapped in the imaging array, acquiring two individual focused images may be difficult to achieve. However, carefully controlling the gap between the template and substrate within the depth of focus of the optical measurement tool and without direct contact between the template and substrate may allow two layers of Moiré patterns to be simultaneously acquired with minimal focusing problems. It is believed that other standard overlay schemes based on the Moirépatterns may be directly implemented to imprint lithography process.

Figure 28:
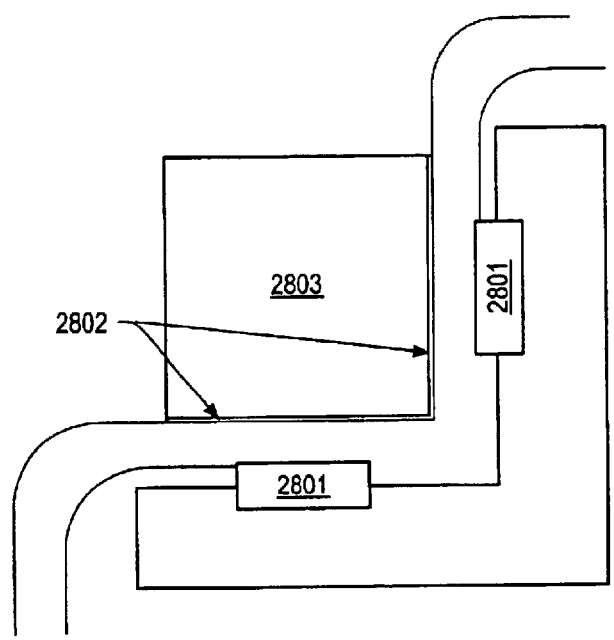
FIG. 28 depicts a schematic view of a capacitive template alignment measuring device.
Figure 29:
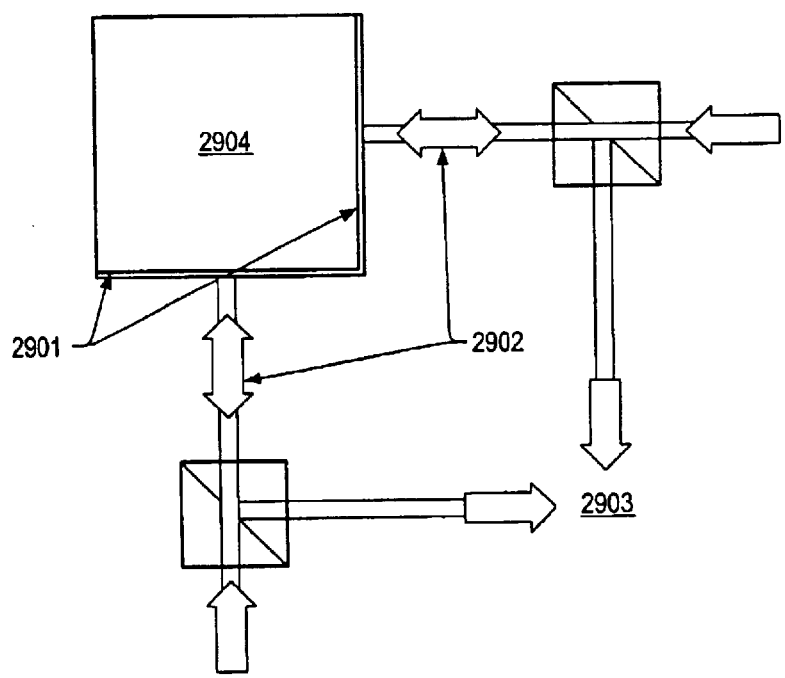
FIG. 29 depicts a schematic view of a laser interferometer alignment measuring device.

Placement errors may be compensated for using capacitance sensors or laser interferometers, and high resolution X-Y stages. In an embodiment where orientation alignments between the template and substrate are independent from X-Y motions, placement error may need to be compensated for only once for an entire substrate (e.g., a semiconductor wafer). Such a method may be referred to as a "global overlay." If orientation alignments between the template and substrate are coupled with X-Y motions and excessive local orientation variations exist on the substrate, X-Y position change of the template may be compensated for using capacitance sensors and/or laser interferometers. Such a method may be referred to as a "field- to-field overlay." FIGS. 28 and 29 depict suitable sensor implementations. FIG. 28 depicts an embodiment of a capacitance sensing system. A capacitance sensing system may include capacitance sensors 2801, a conductive coating 2802, on a template 2803. Thus, by sensing differences in capacitance, the location of template 2803 may be determined. Similarly, FIG. 29 depicts an embodiment of a laser interferometer system including reflective coating 2901, laser signal 2902 and receiver 2903. Laser signals received by receiver 2903 may be used to determine the location of template 2904.

The magnification error, if any exists, may be compensated for by carefully controlling the temperature of the substrate and the template. Using the difference of the thermal expansion properties of the substrate and template, the size of pre-existing patterned areas on the substrate may be adjusted to that of a new template. However, it is believed that the magnification error may be much smaller in magnitude than placement error or theta error when an imprint lithography process is conducted at room temperature and low pressures.

The theta error may be compensated for by using a theta stage that has been widely used for photolithography processes. Theta error may be compensated for by using two separate alignment marks that are separated by a sufficiently large distance to provide a high resolution theta error estimate. The theta error may be compensated for when the template is positioned a few microns apart from the substrate. Therefore, no shearing of existing patterns may occur.

Another concern with overlay alignment for imprint lithography processes that use UV curable liquid materials may be the visibility of the alignment marks. For the overlay error measurement, two overlay marks, one on the template and the other on the substrate may be used. However, since it may be desirable for the template to be transparent to a curing agent, the template overlay marks may typically not include opaque lines. Rather, the template overlay marks may be topographical features of the template surface. In some embodiments, the marks may be made of the same material as the template. In addition, curable liquids may tend to have refractive indices that are similar to those of the template materials (e.g., quartz). Therefore, when the UV curable liquid fills the gap between the template and the substrate, template overlay marks may become very difficult to recognize. If the template overlay marks are made with an opaque material (e.g., chromium), the UV curable liquid below the overlay marks may not be properly exposed to the UV light, which is highly undesirable.

Figure 30:
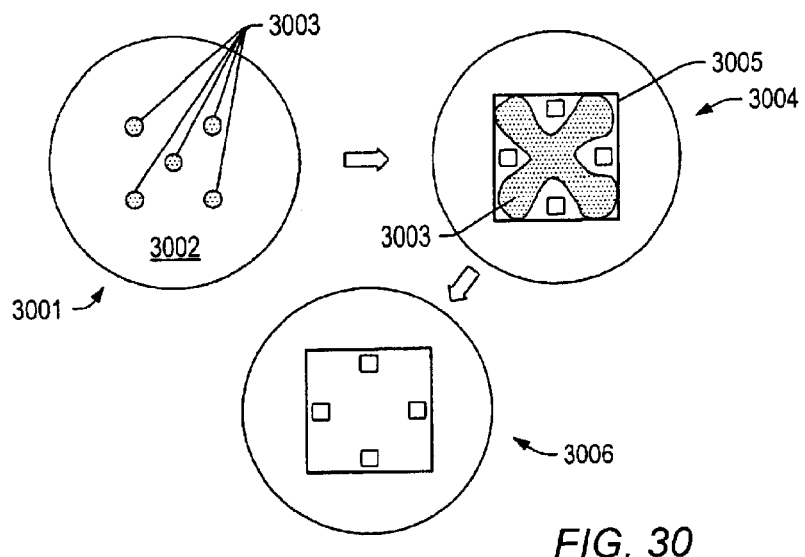
FIG. 30 depicts a scheme for determining alignment with a gap between the template and substrate when the gap is partially filled with fluid.

Two methods are disclosed to overcome the problem of recognizing template overlay mark in the presence of the liquid. A first method uses an accurate liquid dispensing system along with high-resolution gap controlling stages. Suitable liquid dispensing systems and the gap controlling stages are disclosed herein. For the purpose of illustration, three steps of an overlay alignment are depicted in FIG. 30. The locations of the overlay marks and the patterns of the fluid depicted in FIG. 30 are only for the purpose of illustration and should not be construed in a limiting sense. Various other overlay marks, overlay mark locations, and/or liquid dispensing patterns are also possible. First, in step 3001, a liquid 3003 may be dispensed onto substrate 3002. Then, in step 3004, using the high-resolution orientation stage, the gap between template 3005 and substrate 3002 may be carefully controlled so that the dispensed fluid 3003 does not fill the gap between the template and substrate completely. It is believed that at step 3004, the gap may be only slightly larger than the final imprinting gap. Since most of the gap is filled with the fluid, overlay correction can be performed as if the gap were completely filled with the fluid. Upon the completion of the overlay correction, the gap may be closed to a final imprinting gap (step 3006). This may enable spreading of the liquid into the remaining imprint area. Since the gap change between steps 3004 and 3006 may be very small (e.g., about 10 nm), the gap closing motion is unlikely to cause any significant overlay error.

Figure 31:
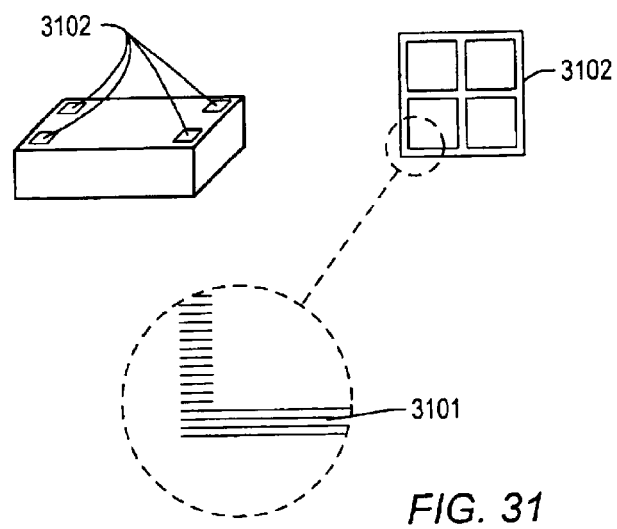
FIG. 31 depicts an alignment mark that includes a plurality of etched lines.

A second method may be to make special overlay marks on the template that may be seen by the overlay measurement tool but may not be opaque to the curing agent (e.g., UV light). An embodiment of this approach is illustrated in FIG. 31. In FIG. 31, instead of completely opaque lines, overlay marks 3102 on the template may be formed of fine polarizing lines 3101. For example, suitable fine polarizing lines may have a width about ½ to ¼ of the wavelength of activating light used as the curing agent. The line width of polarizing lines 3101 should be small enough so that activating light passing between two lines is diffracted sufficiently to cause curing of all the liquid below the lines. In such an embodiment, the activating light may be polarized according to the polarization of overlay marks 3102. Polarizing the activating light may provide a relatively uniform exposure to all the template regions including regions having overlay marks 3102. Light used to locate overlay marks 3102 on the template may be broadband light or a specific wavelength that may not cure the liquid material. This light need not be polarized. Polarized lines 3101 may be substantially opaque to the measuring light, thus making the overlay marks visible using established overlay error measuring tools. Fine polarized overlay marks may be fabricated on the template using existing techniques, such as electron beam lithography.

In a third embodiment, overlay marks may be formed of a different material than the template. For example, a material selected to form the template overlay marks may be substantially opaque to visible light, but transparent to activating light used as the curing agent (e.g., W light). For example, SiOx where x is less than 2 may form such a material. In particular, it is believed that structures formed of SiOx where x is about 1.5 may be substantially opaque to visible light, but transparent to UV light.

Figure 32:
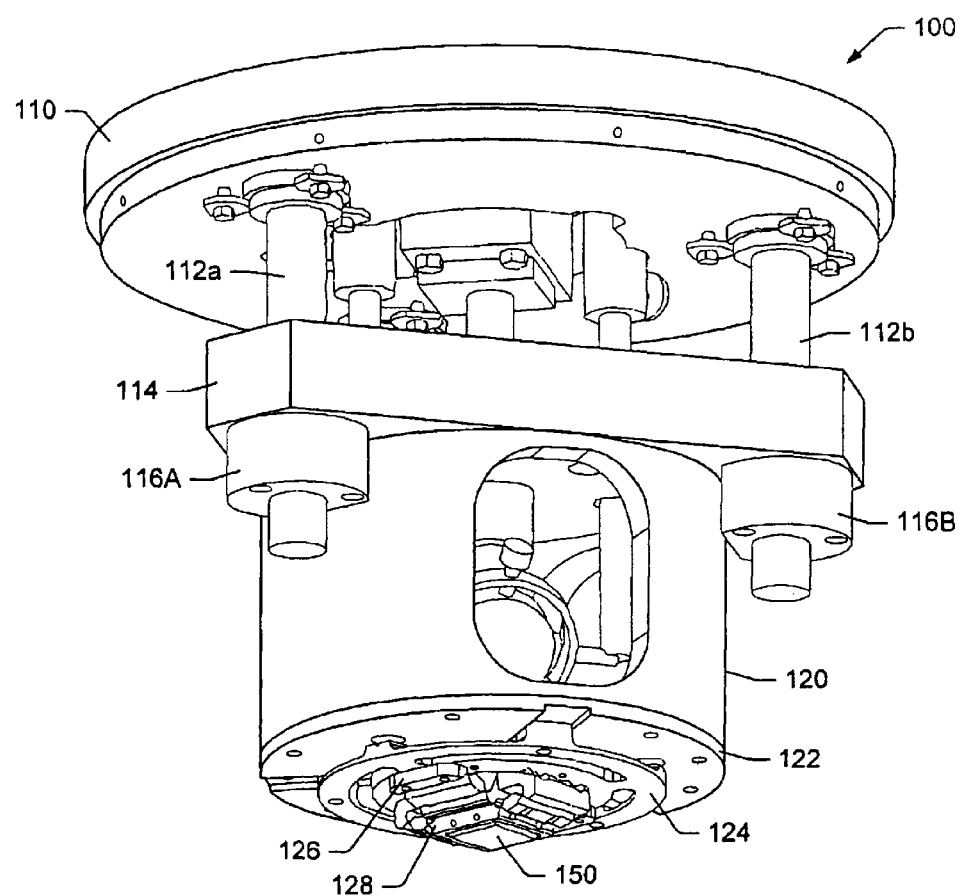
FIG. 32 depicts a projection view of an orientation stage.

FIG. 32, depicts an assembly of a system, denoted generally as 100, for calibrating and orienting a template, such as template 12, about a substrate to be imprinted, such substrate 20. System 100 may be utilized in a machine, such as a stepper, for mass fabrication of devices in a production environment using imprint lithography processes as described herein. As shown, system 100 may be mounted to a top frame 110 which may provide support for a housing 120. Housing 120 may contain the pre-calibration stage for coarse alignment of a template 150 about a substrate (not shown in FIG. 32).

Housing 120 may be coupled to a middle frame 114 with guide shafts 112a, 112b attached to middle frame 114 opposite housing 120. In one embodiment, three (3) guide shafts may be used (the back guide shaft is not visible in FIG. 32) to provide a support for housing 120 as it slides up and down during vertical translation of template 150. Sliders 116a and 116b attached to corresponding guide shafts 112a, 112b about middle frame 114 may facilitate this up and down motion of housing 120.

Figure 33:
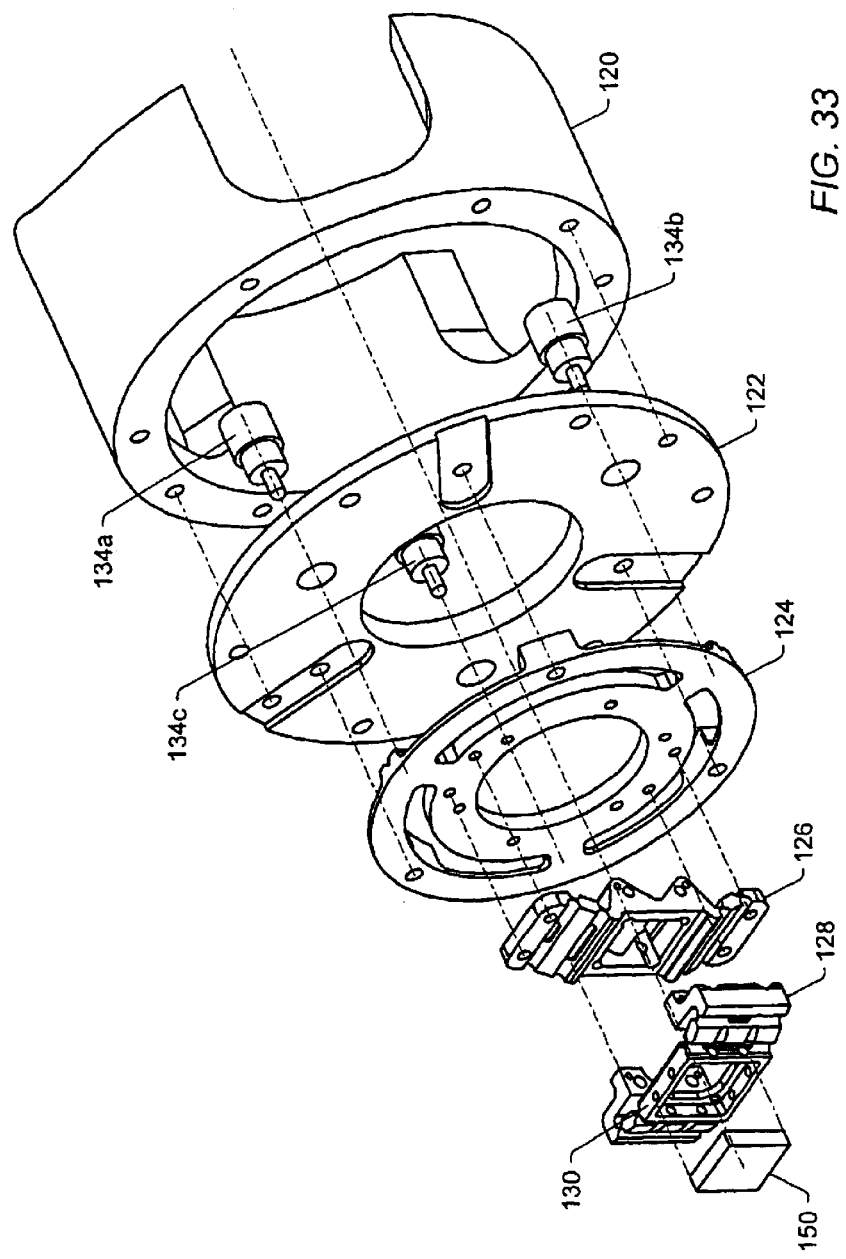
FIG. 33 depicts an exploded view of the orientation stage.

System 100 may include a disk-shaped base plate 122 attached to the bottom portion of housing 120. Base plate 122 may be coupled to a disk-shaped flexure ring 124. Flexure ring 124 may support the lower placed orientation stage included in first flexure member 126 and second flexure member 128. The operation and configuration of the flexure members 126, 128 are discussed in detail below. As depicted in FIG. 33, the second flexure member 128 may include a template support 130, which may hold template 150 in place during the imprinting process. Typically, template 150 may include a piece of quartz with desired features imprinted on it, Template 150 may also include other substances according to well-known methods.

As shown in FIG. 33, actuators 134a, 134b and 134c may be fixed within housing 120 and operably coupled to base plate 122 and flexure ring 124. In operation, actuators 134a, 134b and 134c may be controlled such that motion of the flexure ring 124 is achieved. Motion of the actuators may allow for coarse pre-calibration. In some embodiments, actuators 134a, 134b and 134c may include high resolution actuators. In such embodiments, the actuators may be equally spaced around housing 120. Such an embodiment may permit very precise translation of the ring 124 in the vertical direction to control the gap accurately. Thus, the system 100 may be capable of achieving coarse orientation alignment and precise gap control of template 150 with respect to a substrate to be imprinted.

System 100 may include a mechanism that enables precise control of template 150 so that precise orientation alignment may be achieved and a uniform gap may be maintained by the template with respect to a substrate surface. Additionally, system 100 may provide a way of separating template 150 from the surface of the substrate following imprinting without shearing of features from the substrate surface. Precise alignment and gap control may be facilitated by the configuration of the first and second flexure members, 126 and 128, respectively.

Figure 51A:
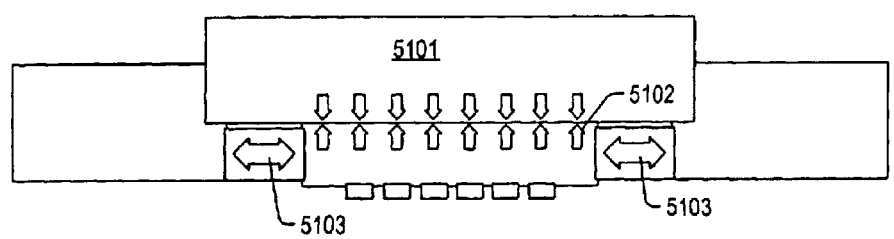
FIGS. 51A–B depict a schematic view of a template support system.
Figure 51B:
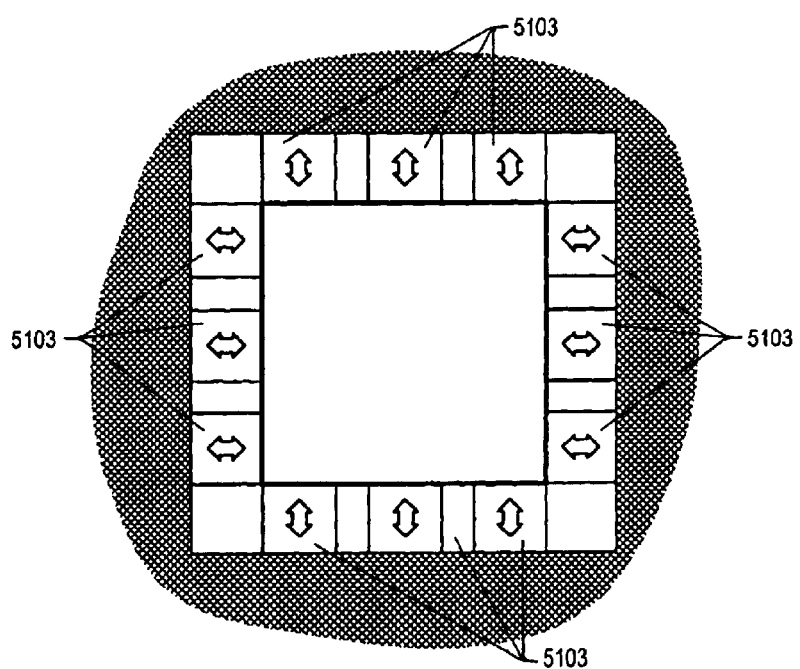

In an embodiment, template 5102 may be held in place using a separated, fixed supporting plate 5101 that is transparent to the curing agent as depicted in FIG. 51. While supporting plate 5101 behind template 5102 may support the imprinting force, applying vacuum between fixed supporting plate 5101 and template 5102 may support the separation force. In order to support template 5102 for lateral forces, piezo actuators 5103 may be used. The lateral supporting forces may be carefully controlled by using piezo actuators 5103. This design may also provide the magnification and distortion correction capability for layer-to-layer alignment in imprint lithography processes. Distortion correction may be very important to overcome stitching and placement errors present in the template structures made by electron beam lithography, and to compensate for distortion in the previous structures present on the substrate. Magnification correction may only require one piezo actuator on each side of the template (i.e. total of 4 piezo actuators for a four sided template). The actuators may be connected to the template surface in such a way that a uniform force may be applied on the entire surface. Distortion correction, on the other hand, may require several independent piezo actuators that may apply independently controlled forces on each side of the template. Depending on the level of distortion control required, the number of independent piezo actuators may be specified. More piezo actuators may provide better control of distortion. The magnification and distortion error correction should be completed prior to the use of vacuum to constrain the top surface of the template. This is because magnification and distortion correction may be properly controlled only if both the top and bottom surfaces of the template are unconstrained. In some embodiments, the template holder system of FIG. 51 may have a mechanical design that causes obstruction of the curing agent to a portion of the area under template 5102. This may be undesirable because a portion of the liquid below template 5102 may not cure. This liquid may stick to the template causing problems with further use of the template. This problem with the template holder may be avoided by incorporating a set of mirrors into the template holder to divert the obstructed curing agent in such a way that the curing agent directed to the region below one edge of template 5102 may be bent to cure an obstructed portion below the other edge of template 5102.

In an embodiment, high resolution gap sensing may be achieved by designing the template such that the minimum gap between the substrate and template falls within a sensing technique's usable range. The gap being measured may be manipulated independently of the actual patterned surface. This may allow gap control to be performed within the useful range of the sensing technique. For example, if a spectral reflectivity analysis technique with a useful sensing range of about 150 nm to 20 microns is to be used to analyze the gap, then the template may have features patterned into the template with a depth of about 150 nm or greater. This may ensure that the minimum gap to be sensed is greater than 150 nm.

As the template is lowered toward the substrate, the fluid may be expelled from the gap between the substrate and the template. The gap between the substrate and the template may approach a lower practical limit when the viscous forces approach equilibrium conditions with the applied compressive force. This may occur when the surface of the template is in close proximity to the substrate. For example, this regime may be at a gap height of about 100 nm for a 1 cP fluid when 14 kPa is applied for 1 sec to a template with a radius of 1 cm. As a result, the gap may be self-limiting provided a uniform and parallel gap is maintained. Also, a fairly predictable amount of fluid may be expelled (or entrained). The volume of fluid entrained may be predictable based on careful fluid dynamic and surface phenomena calculations.

For production-scale imprint patterning, it may be desired to control the inclination and gap of the template with respect to a substrate. In order to accomplish the orientation and gap control, a template manufactured with reticle fabrication techniques may be used in combination with gap sensing technology such as i) single wavelength interferometry, ii) multi-wavelength interferometry, iii) ellipsometry, iv) capacitance sensors, or v) pressure sensors.

In an embodiment, a method of detecting gap between template and substrate may be used in computing thickness of films on the substrate. A description of a technique based on Fast Fourier Transform (FFT) of reflective data obtained from a broad-band spectrometer is disclosed herein. This technique may be used for measuring the gap between the template and the substrate, as well as for measuring film thickness. For multi-layer films, the technique may provide an average thickness of each thin film and its thickness variations. Also, the average gap and orientation information between two surfaces in close proximity, such as the template-substrate for imprint lithography processes may be acquired by measuring gaps at a minimum of three distinct points through one of the surfaces.

In an embodiment, a gap measurement process may be based on the combination of the broad-band interferometry and Fast Fourier Transform (FFT). Several applications in current industry utilized various curve fitting techniques for the broad-band interferometry to measure a single layer film thickness. However, it is expected that such techniques may not provide real time gap measurements, especially in the case of multi-layer films, for imprint lithography processes. In order to overcome such problems, first the reflective indexes may be digitized in wavenumber domain, between $1_{\lambda/high}$ and $1_{\lambda/low}$. Then, the digitized data may be processed using a FFT algorithm. This novel approach may yield a clear peak of the FFT signal that accurately corresponds to the measured gap. For the case of two layers, the FFT signal may yield two clear peaks that are linearly related to the thickness of each layer.

Figure 52:
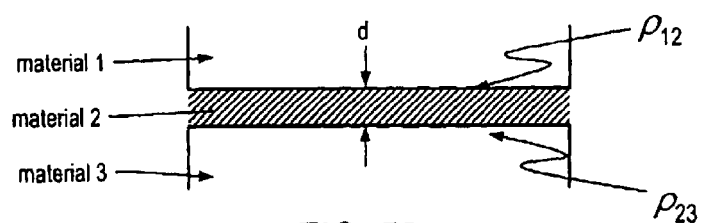
FIG. 52 depicts a side view of a gap between a template and a substrate.

For optical thin films, the oscillations in the reflectivity are periodic in wavenumber (w) not wavelength ($\lambda$), such as shown in the reflectivity of a single optical thin film by the following equation, $$R = \frac{\rho_{1,2}^2 + \rho_{2,3}^2 e^{-2\alpha d} - 2\rho_{1,2}\rho_{2,3}e^{-\alpha d}\cos(4\pi nd/\lambda)}{1 - (\rho_{1,2}\rho_{2,3})^2 e^{-2\alpha d} + 2\rho_{1,2}\rho_{2,3}e^{-\alpha d}\cos(4\pi nd/\lambda)},$$

where $\rho_{i,i+1}$ are the reflectivity coefficients at the interface of the i-1 and i interface, n is the index of refraction, d is the thickness to measure of the film (material 2 of FIG. 52), and a is the absorption coefficient of the film (material 2 of FIG. 52). Here, w=1/$\lambda$.

Due to this characteristic, Fourier analysis may be a useful technique to determine the period of the function R represented in terms of w. It is noted that, for a single thin film, a clearly defined single peak ($P_1$) may result when a Fourier transform of R(w) is obtained. The film thickness (d) may be a function of the location of this peak such as, $$d=P_1/(\Delta w \times 2n), \quad (8)$$

where $\Delta w = W_f - W_s$; $W_f = 1/\lambda_{min}$ and $W_s = 1/\lambda_{max}$.

FFT is an established technique in which the frequency of a discrete signal may be calculated in a computationally efficient way. Thus, this technique may be useful for in-situ analysis and real-time applications. FIG. 34 depicts an embodiment of a process flow of film thickness or gap, measurement via a FFT process of a reflectivity signal. For multi-layer films with distinct reflective indexes, locations of peaks in a FFT process may correspond to linear combinations of each film thickness. For example, a two-layer film may lead to two distinct peak locations in a FFT analysis. FIG. 35 depicts a method of determining the thickness of two films based on two peak locations.

Embodiments presented herein may enable measuring a gap or film thickness even when the oscillation of the reflectivity data includes less than one full period within the measuring wavenumber range. In such a case, FFT may result in an inaccurate peak location. In order to overcome such a problem and to extend the lower limit of the measurable film thickness, a novel method is disclosed herein. Instead of using a FFT algorithm to compute the period of the oscillation, an algorithm to find a local minimum ($W_1$) or maximum point ($W_2$) of the reflectivity between $W_s$ and $W_f$ may be used to compute the period information: dR/dw=0 at $W_1$ and $W_2$. The reflectivity R(w) of Equation 7 has its maximum at w=0. Further, the wavenumber range ($\Delta w$) of typical spectrometers ma be larger than $W_s$. For a Spectrometer with 200 nm–800 nm wavelength range, $\Delta w$=3/800 whereas $W_s$=1/800. Therefore, the oscillation length of the reflectivity data between 0-$W_s$ may be smaller than that of $\Delta w$. As depicted in FIG. 36, there may be two cases of the locations of minimum and maximum in the $\Delta w$ range, given that w=0 is a maximum point of R(w). Therefore, the film thickness can be computed as follows:

Case 1 WW0: a local minimum exists at WI. Therefore, $W_1$=one half of the periodic oscillation, and hence d=0.5/($w_1$×2n).

Case 2 WW1: a local maximum exists at $W_2$. Therefore, $W_2$=one period of the periodic oscillation, and hence d=1/($w_2$×2n).

A practical configuration of the measurement tool may include a broad-band light source, a spectrometer with fiber optics, a data acquisition board, and a processing computer. Several existing signal processing techniques may improve the sensitivity of the FFT data. For example, techniques including but not limited to: filtering, magnification, increased number of data points, different range of wavelengths, etc., may be utilized with gap or film thickness measurement methods disclosed herein.

Embodiments disclosed herein include a high precision gap and orientation measurement method between two flats (e.g., a template and a substrate). Gap and orientation measurement methods presented herein include use of broad-band interferometry and fringe based interferometry. In an embodiment, a method disclosed herein which uses broad-band interferometry may overcome a disadvantage of broad-band interferometer, namely its inability to accurately measure gaps smaller than about ¼ of the mean wavelength of the broad-band signal. Interference fringe based interferometry may be used for sensing errors in the orientation of the template soon after it is installed.

Figure 37:
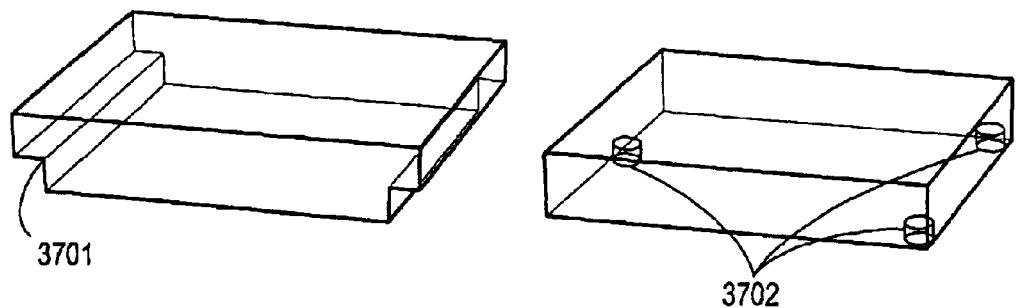
FIG. 37 depicts a template with gap measuring recesses.

Imprint lithography processes may be implemented to manufacture single and multi-layer devices. Single layer devices, such as micron size optical mirrors, high resolution light filters and light guides, may be manufactured by forming a thin layer of material in certain geometric shapes on substrates. The imprinted layer thickness of some of these devices may be less than ¼ of the mean wavelength of a broad-band signal, and may be uniform across an active area. A disadvantage of broad-band interferometry may be that it may be unable to accurately measure gaps smaller than about ¼ of the mean wavelength of the broad-band signal (e.g., about 180 nm). In an embodiment, micrometer size steps, which may be measured accurately, may be etched into the surface of the template. As depicted in FIG. 37, steps may be etched down in the forms of continuous lines 3701 or multiple isolated dots 3702 where measurements may be made. Isolated dots 3702 may be preferable from the point of view of maximizing the useful active area on the template. When the patterned template surface is only a few nanometers from the substrate, a broad-band interferometer may measure the gap accurately without suffering from minimum gap measurement problems.

Figure 38:
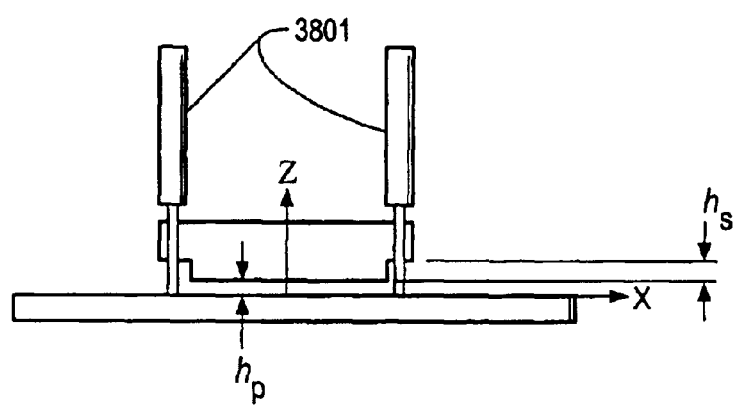
FIG. 38 depicts a schematic for using an interferometer to measure a gap between a template and interferometer.
Figure 39:
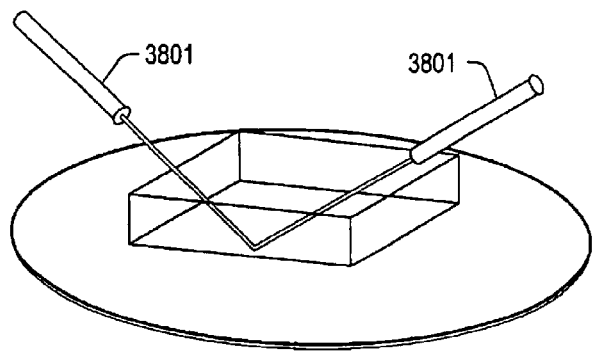
FIG. 39 depicts a schematic for probing the gap between a template and a substrate using a probe-prism combination.

FIG. 38 depicts a schematic of the gap measurement described here. Probes 3801 may also be used in an inclined configuration, such as depicted in FIG. 39. If more than three probes are used, the gap measurement accuracy may be improved by using the redundant information. For simplicity's sake, the ensuing description assumes the use of three probes. The step size, $h_s$, is magnified for the purpose of illustration. The average gap at the patterned area, $h_p$, may be given as:

$$h_p = [(h_1 + h_2 + h_3)/3] - h_s, \qquad (9)$$

When the positions of the probes are known $((X_i, Y_i)$, where X and y axes are on the substrate surface), the relative orientation of the template with respect to the substrate may be expressed as a unit vector (D) that is normal to the template surface with respect to a frame whose x-y axes lie on the top surface of the substrate.

$$n = r/\|r\|, \qquad (10)$$

where, $r = [(X_3, Y_3, h_3) - (X_1, Y_1, h_1)] \times [(X_2, Y_2, h_2) - (X_1, Y_1, h_1)]$. Perfect orientation alignment between two flats may be achieved when $n = (0 0 1)^T$, or $h_1 = h_2 = h_3$.

Measured gaps and orientations may be used as feedback information to imprinting actuators. The size of the measuring broad-band interferometric beam may be as small as about 75 μm. For a practical imprint lithography process, it may be desirable to minimize the clear area used only to measure the gap since no pattern can be etched into the clear area. Further, blockage of the curing agent due to the presence of a measurement tool should be minimized.

Figure 40:
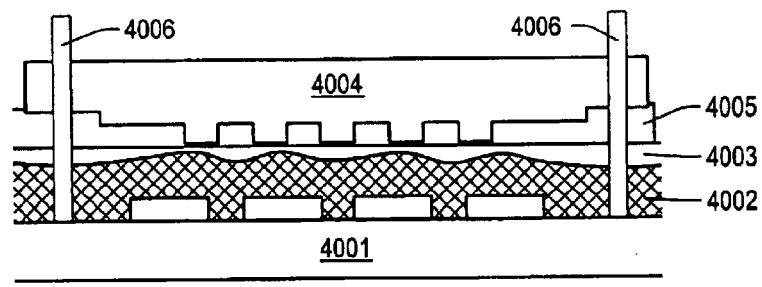
FIG. 40 depicts a cross-sectional view of an imprint lithographic process.

FIG. 40 depicts a schematic of multi-layer materials on substrates. For example, substrate 4001 has layers 4002, and 4003, and fluid 4005 between substrate 4001 and template 4004. These material layers may be used to transfer multiple patterns, one by one vertically, onto the substrate surface. Each thickness may be uniform at the clear area where a gap measurement may be made using light beams 4006. It has been shown that, using broad-band interferometry, the thickness of a top layer may be measured accurately in the presence of multi-layer films. When the optical properties and thicknesses of lower layer films are known accurately, the gap and orientation information between the template and substrate surface (or metal deposited surfaces for multi-layer devices) may be obtained by measuring the top layer thickness. The thickness of each layer may be measured using the same sensing measurement probes.

Figure 41:
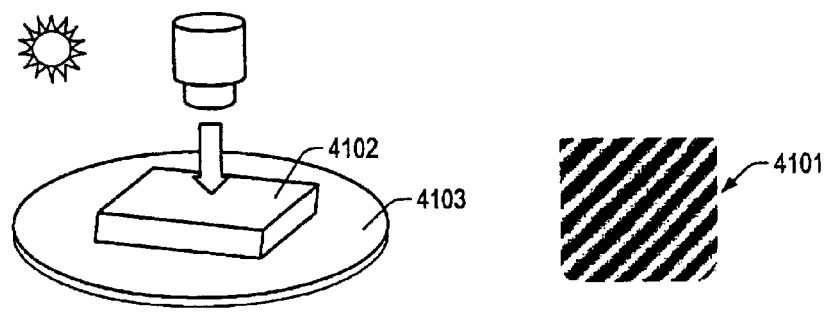
FIG. 41 depicts a schematic of a process for illuminating a template.

It may be necessary to perform orientation measurement and corresponding calibration when a new template is installed or a machine component is reconfigured. The orientation error between the template 4102 and substrate 4103 may be measured via an interference fringe pattern at the template and substrate interface as depicted in FIG. 41. For two optical flats, the interference fringe pattern may appear as parallel dark and light bands 4101. Orientation calibration may be performed using a pre-calibration stage as disclosed herein. Differential micrometers may be used to adjust the relative orientation of the template with respect to the substrate surface. Using this approach, if no interference fringe band is present, the orientation error may be corrected to be less than ¼ of the wavelength of light source used.

Figure 42A:
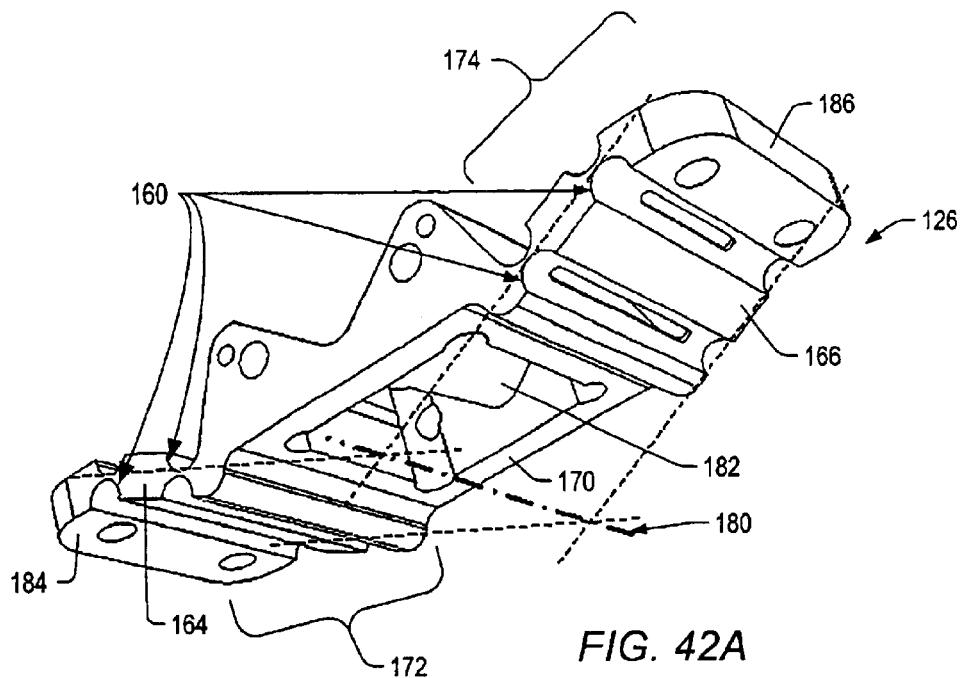
FIGS. 42A–B depict a projection view of a flexure member.
Figure 42B:
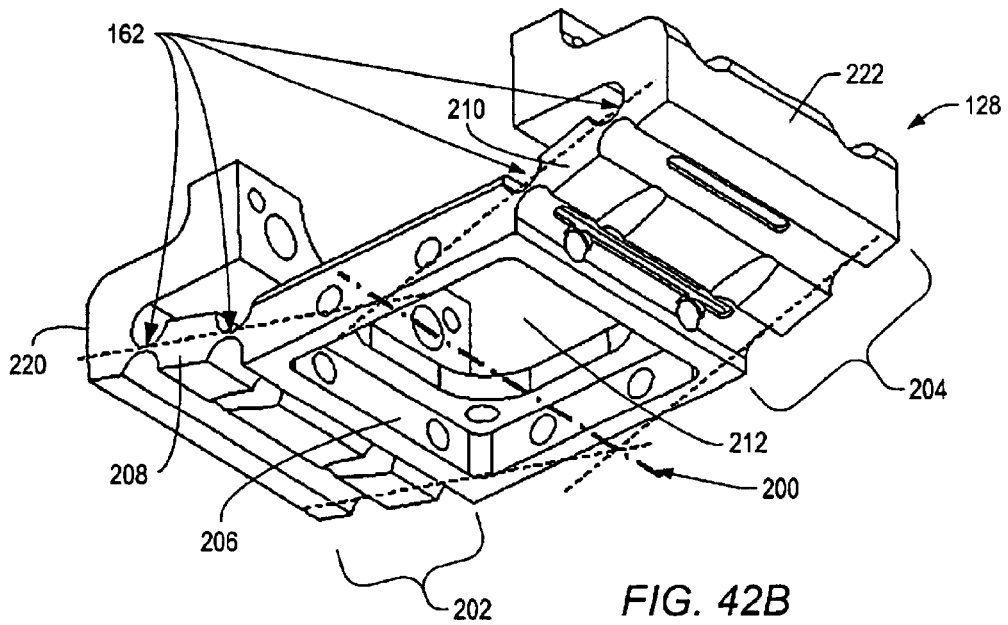

With reference to FIGS. 42A and 42B, therein are depicted embodiments of the first and second flexure members, 126 and 128, respectively, in more detail. Specifically, the first flexure member 126 may include a plurality of flexure joints 160 coupled to corresponding rigid bodies 164, 166. Flexure joints 160 and rigid bodies 164, and 166 may form part of arms 172, 174 extending from a frame 170. Flexure frame 170 may have an opening 182, which may permit the penetration of a curing agent (e.g., UV light) to reach the template 150 when held in support 130. In some embodiments, four (4) flexure joints 160 may provide motion of the flexure member 126 about a first orientation axis 180. Frame 170 of first flexure member 126 may provide a coupling mechanism for joining with second flexure member 128 as illustrated in FIG. 43.

Likewise, second flexure member 128 may include a pair of arms 202, 204 extending from a frame 206. Arms 202 and 204 may include flexure joints 162 and corresponding rigid bodies 208, 210. Rigid bodies 208 and 210 may be adapted to cause motion of flexure member 128 about a second orientation axis 200. A template support 130 maybe integrated with frame 206 of the second flexure member 128. Like frame 182, frame 206 may have an opening 212 permitting a curing agent to reach template 150 which may be held by support 130.

Figure 43:
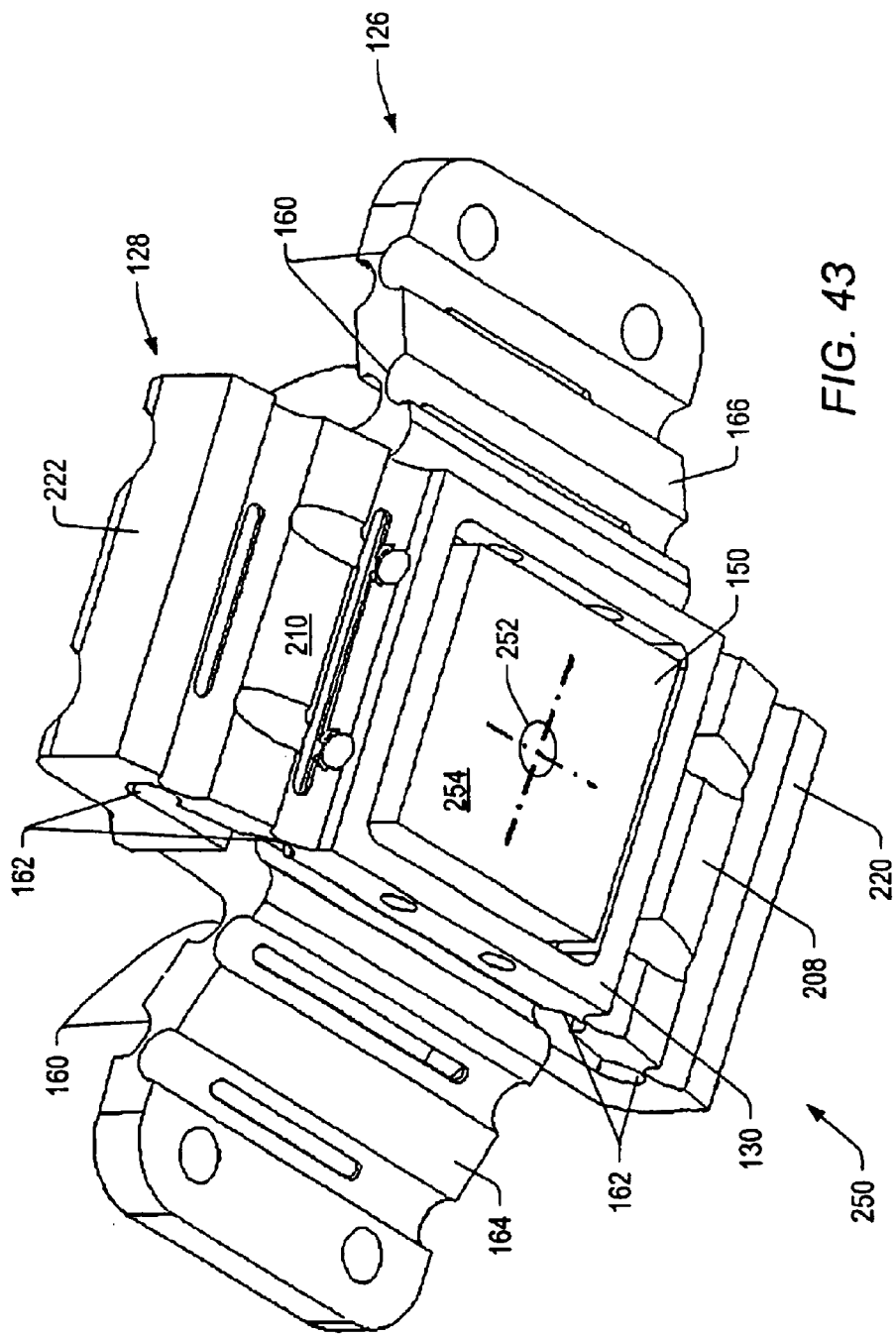
FIG. 43 depicts a first and second flexure member assembled for use.

In operation, first flexure member 126 and second flexure member 128 may be joined as shown in FIG. 43 to form orientation stage 250. Braces 220, 222 may be provided in order to facilitate joining of the two pieces such that the first orientation axis 180 and second orientation axis 200 are substantially orthogonal to each other. In such a configuration, first orientation axis 180 and second orientation axis may intersect at a pivot point 252 at approximately the template substrate interface 254. The fact that first orientation axis 180 and second orientation axis 200 are orthogonal and lie on interface 254 may provide fine alignment and gap control. Specifically, with this arrangement, a decoupling of orientation alignment from layer-to-layer overlay alignment may be achieved. Furthermore, as explained below, the relative position of first orientation axis 180 and second orientation axis 200 may provide an orientation stage 250 that may be used to separate the template 150 from a substrate without shearing of desired features. Thus, features transferred from the template 150 may remain intact on the substrate.

Referring to FIGS. 42A, 42B and 43, flexure joints 160 and 162 may be notched shaped to provide motion of rigid bodies 164, 166, 208, 210 about pivot axes that are located along the thinnest cross section of the notches. This configuration may provide two (2) flexure-based sub-systems for a fine decoupled orientation stage 250 having decoupled compliant motion axes 180,200. Flexure members 126, 128 may be assembled via mating of surfaces such that motion of template 150 may occur about pivot point 252 substantially eliminating "swinging" and other motions that could shear imprinted features from the substrate. Thus, orientation stage 250 may precisely move the template 150 about a pivot point 252; thereby, eliminating shearing of desired features from a substrate following imprint lithography.

Figure 44:
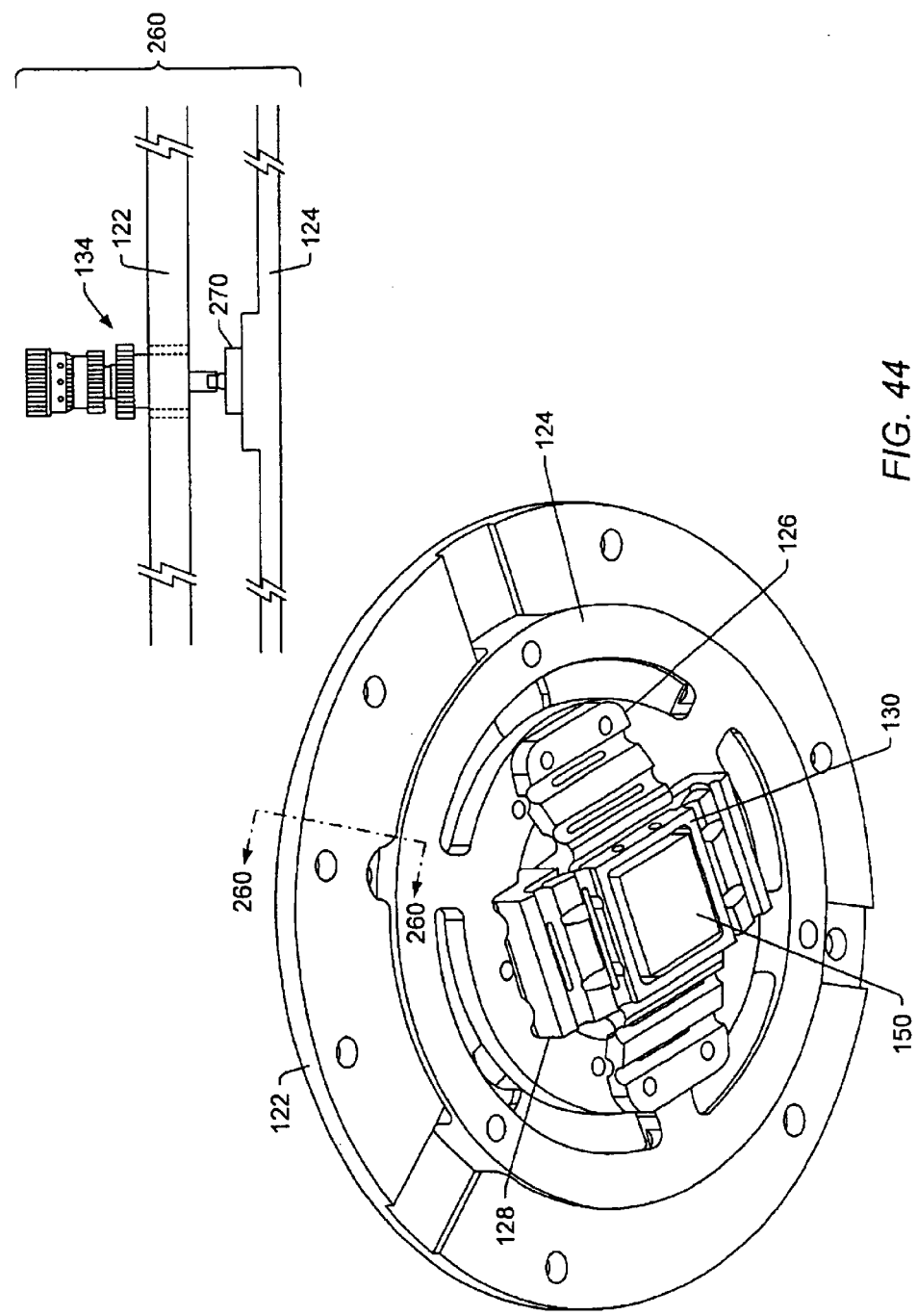
FIG. 44 depicts a projection view of the bottom of an orientation stage.

Referring to FIG. 44, during operation of system 100, a Z-translation stage (not shown) may control the distance between template 150 and the substrate without providing orientation alignment. A pre-calibration stage 260 may perform a preliminary alignment operation between template 150 and the substrate surfaces to bring the relative alignment within the motion range limits of orientation stage 250. In certain embodiments, pre-calibration may be required only when a new template is installed into the machine.

Figure 45:
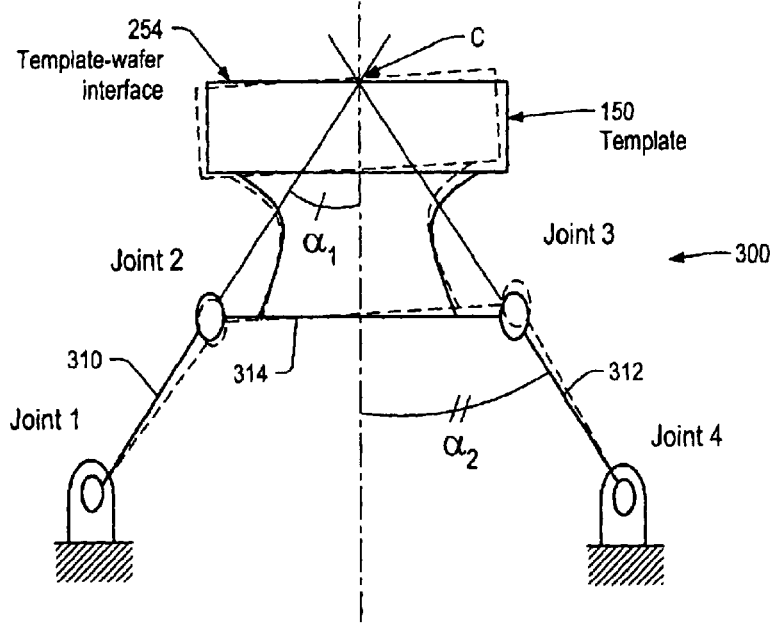
FIG. 45 depicts a schematic view of a flexure arm.

With reference to FIG. 45, therein is depicted a flexure model, denoted generally as 300, useful in understanding the principles of operation of a fine decoupled orientation stage, such as orientation stage 250. Flexure model 300 may include four (4) parallel joints: joints 1, 2, 3 and 4, that provide a four-bar-linkage system in its nominal and rotated configurations. Line 310 may pass though joints 1 and 2. Line 312 may pass through joints 3 and 4. Angles α1 and α2 may be selected so that the compliant alignment (or orientation axis) axis lies substantially on the template-wafer interface 254. For fine orientation changes, rigid body 311 between joints 2 and 3 may rotate about an axis depicted by Point C. Rigid body 314 may be representative of rigid bodies 170 and 206 of flexure members 126 and 128.

Mounting a second flexure component orthogonally onto the first one (as depicted in FIG. 43) may provide a device with two decoupled orientation axes that are orthogonal to each other and lie on the template-substrate interface 254. The flexure components may be adapted to have openings to allow a curing agent (e.g., UV light) to pass through the template 150.

The orientation stage 250 may be capable of fine alignment and precise motion of template 150 with respect to a substrate. Ideally, the orientation adjustment may lead to negligible lateral motion at the interface and negligible twisting motion about the normal to the interface surface due to selectively constrained high structural stiffness. Another advantage of flexure members 126, 128 with flexure joints 160, 162 may be that they may not generate particles as frictional joints may. This may be an important factor in the success of an imprint lithography process as particles may be particularly harmful to such processes.

Due to the need for fine gap control, embodiments presented herein may require the availability of a gap sensing method capable of measuring small gaps of the order of 500 nm or less between the template and substrate. Such a gap sensing method may require a resolution of about 50 nanometers, or less. Ideally, such gap sensing may be provided in real-time. Providing gap sensing in real-time may allow the gap sensing to be used to generate a feedback signal to actively control the actuators.

Figure 46:
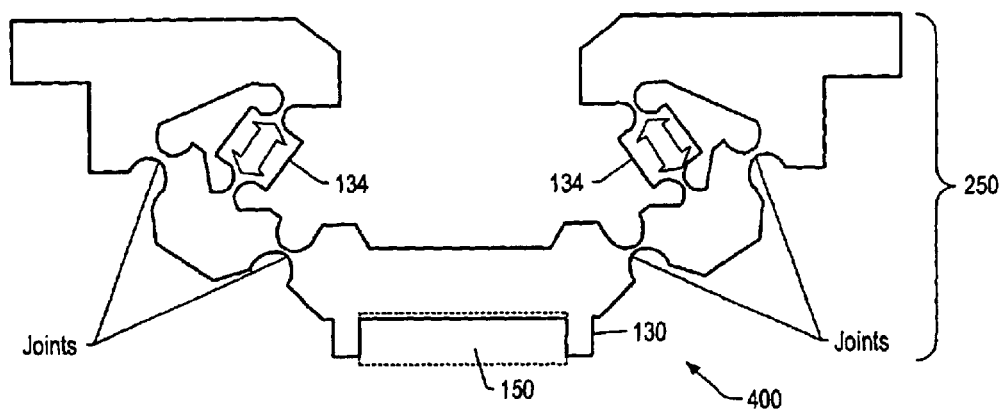
FIG. 46 depicts a cross-sectional view of a pair of flexure arms.

In an embodiment, a flexure member having active compliance may be provided. For example, FIG. 46 depicts a flexure member, denoted generally as 400, including piezo actuators. Flexure member 400 may be combined with a second flexure member to form an active orientation stage 250. Flexure member 400 may generate pure tilting motions with no lateral motions at the template-substrate interface. Using such a flexure member, a single overlay alignment step may allow the imprinting of a layer on an entire semiconductor wafer. This is in contrast to overlay alignment with coupled motions between the orientation and lateral motions. Such overlay alignment steps may lead to disturbances in X-Y alignment, and therefore may require a complicated field-to-field overlay control loop to ensure proper alignment.

In an embodiment, flexure member 400 may possess high stiffness in the directions where side motions or rotations are undesirable and lower stiffness in directions where necessary orientation motions are desirable. Such an embodiment may provide a selectively compliant device. That is, flexure member 400 may support relatively high loads while achieving proper orientation kinematics between the template and the substrate.

Figure 47:
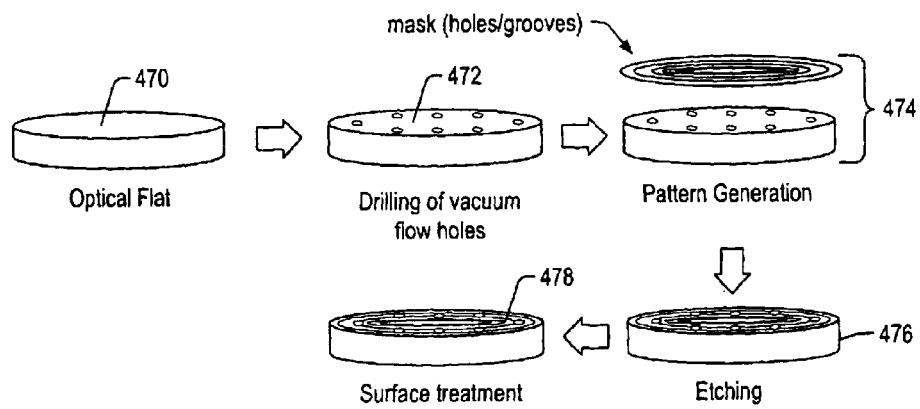
FIG. 47 depicts a scheme for planarization of a substrate.

With imprint lithography, it may be desirable to maintain a uniform gap between two nearly flat surfaces (i.e., the template and the substrate). Template 150 may be made from optical flat glass to ensure that it is substantially flat on the bottom. The template may be patterned using electron beam lithography. The substrate (e.g., a semiconductor wafer), however, may exhibit a "potato chip" effect resulting in micron-scale variations on its topography. Vacuum chuck 478 (as shown in FIG. 47), may eliminate variations across a surface of the substrate that may occur during imprinting.

Figure 48A:
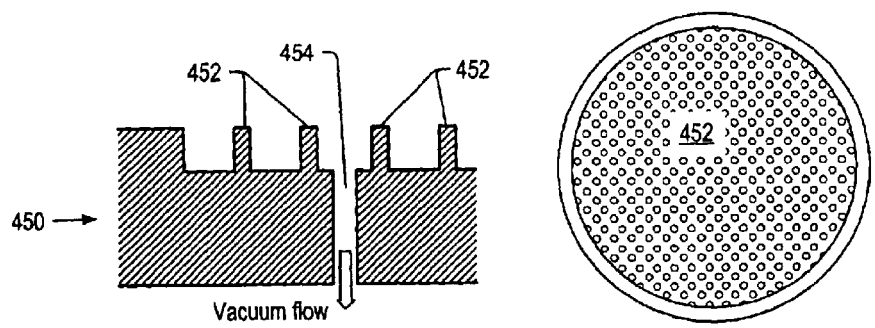
FIGS. 48A–B depict various views of a vacuum chuck for holding a substrate.
Figure 48B:
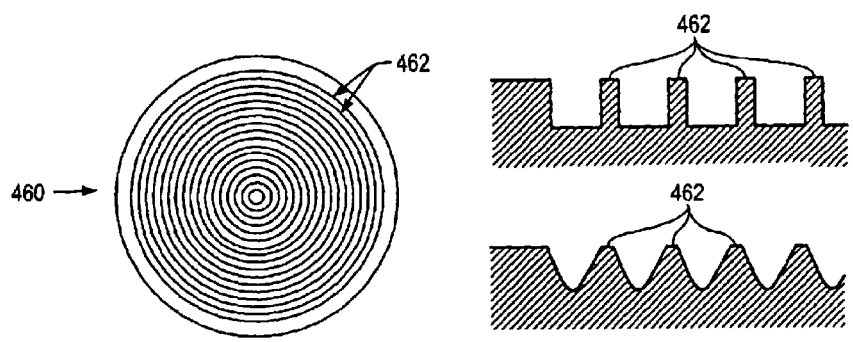

Vacuum chuck 478 may serve two primary purposes. First, vacuum chuck 478 may be utilized to hold the substrate in place during imprinting and to ensure that the substrate stays flat during the imprinting process. Additionally, vacuum chuck 478 may ensure that no particles are present on the back of the substrate during processing. This may be especially important to imprint lithography as particles may create problems that ruin the device and decrease production yields. FIGS. 48A and 48B illustrate variations of a vacuum chuck suitable for these purposes according to two embodiments.

In FIG. 48A, a pin-type vacuum chuck 450 is shown as having a large number of pins 452. It is believed that vacuum chuck 450 may eliminate "potato chip" effects as well as other deflections on the substrate during processing. A vacuum channel 454 may be provided as a means of applying vacuum to the substrate to keep it in place. The spacing between the pins 452 may be maintained such that the substrate will not bow substantially from the force applied through vacuum channel 454. At the same time, the tips of pins 452 may be small enough to reduce the chance of particles settling on top of them.

FIG. 48B depicts a groove-type vacuum chuck 460 with a plurality of grooves 462 across its surface. Grooves 462 may perform a similar function to pins 454 of the pin-type vacuum chuck 450. As shown, grooves 462 may take on either a wall shape 464 or a smooth curved cross section 466. The cross section of grooves 462 for groove-type vacuum chuck 462 may be adjusted through an etching process. Also, the space and size of each groove may be as small as hundreds of microns. Vacuum flow to each of grooves 462 may be provided through fine vacuum channels across multiple grooves that run in parallel with respect to the chuck surface. The fine vacuum channels may be formed along with grooves through an etching process.

FIG. 47 illustrates the manufacturing process for both pin-type vacuum chuck 450 and groove-type vacuum chuck 460. Using optical flat 470, no additional grinding and/or polishing steps may be needed for this process. Drilling at determined locations on the optical flat 470 may produce vacuum flow holes 472. Optical flat 470 may then be masked and patterned 474 before etching 476 to produce the desired features (e.g., pins or grooves) on the upper surface of the optical flat. The surface of optical flat 470 may then be treated 479 using well-known methods.

Figure 49A:
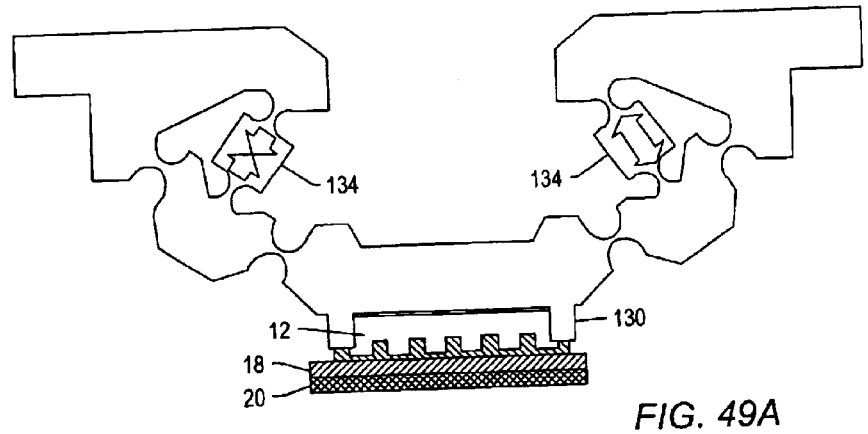
FIGS. 49A–C depict a scheme for removing a template from a substrate after curing.
Figure 49B:
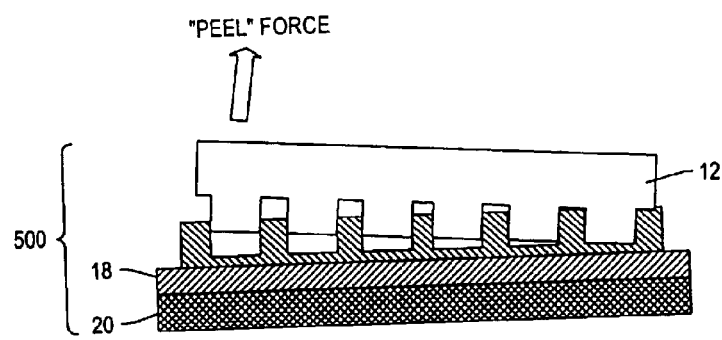
Figure 49C:
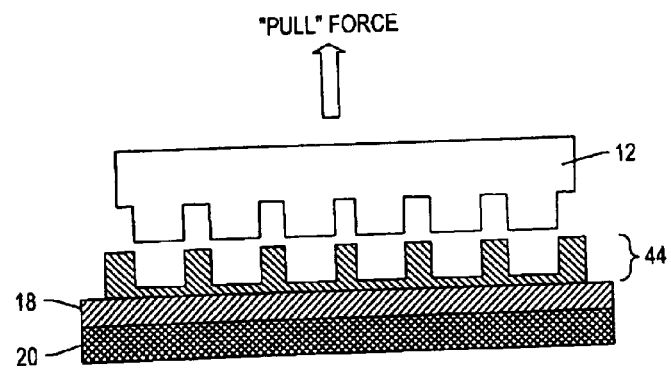
Figure 50A:
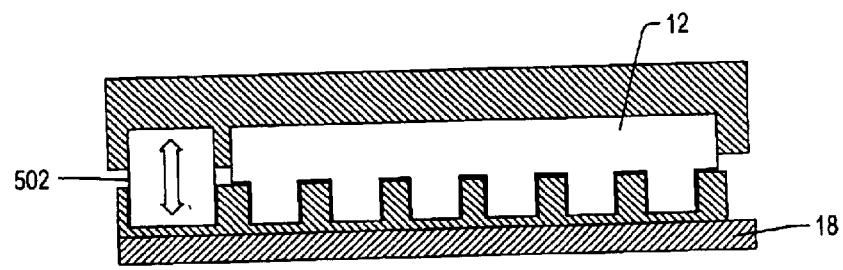
FIGS. 50A–C depict a cross-sectional view of a method for removing a template from a substrate after curing.
Figure 50B:
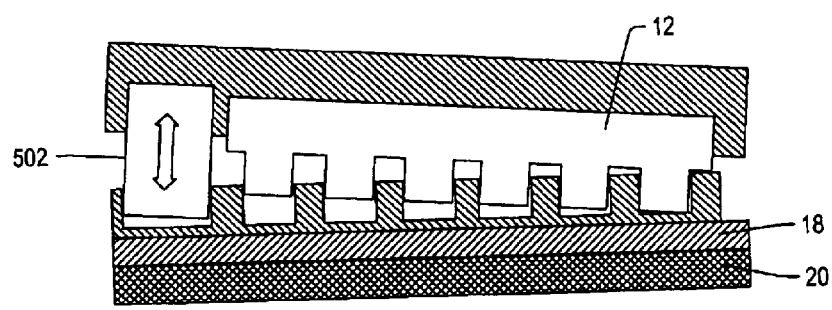
Figure 50C:
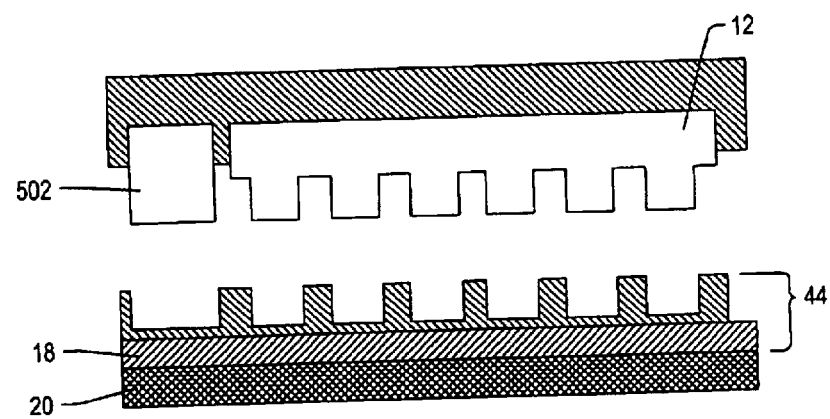

As discussed above, separation of template 150 from the imprinted layer may be a critical, final step in the imprint lithography process. Since the template 150 and substrate may be almost perfectly parallel, the assembly of the template, imprinted layer, and substrate leads to a substantially uniform contact between near optical flats. Such a system may usually require a large separation force. In the case of a flexible template or substrate, the separation may be merely a "peeling process." However, a flexible template or substrate may be undesirable from the point of view of high-resolution overlay alignment. In case of quartz template and silicon substrate, the peeling process may not be implemented easily. However, separation of the template from an imprinted layer may be performed successfully by a "peel and pull" process. A first peel and pull process is illustrated in FIGS. 49A, 49B, and 49C. A second peel and pull process is illustrated in FIGS. 50A, 50B, and 50C. A process to separate the template from the imprinted layer may include a combination of the first and second peel and pull processes.

For clarity, reference numerals 12, 18, 20, and 40 are used in referring to the template, transfer layer, substrate, and curable substance, respectively, in accordance with FIGS. 1A and 1B. After curing of the substance 40, either the template 12 or substrate 20 may be tilted to intentionally induce an angle between the template 12 and substrate 20. Orientation stage 250 may be used for this purpose. Substrate 20 is held in place by vacuum chuck 478. The relative lateral motion between the template 12 and substrate 20 may be insignificant during the tilting motion if the tilting axis is located close to the template-substrate interface. Once the angle between template 12 and substrate 20 is large enough, template 12 may be separated from the substrate 20 using only Z-axis motion (i.e. vertical motion). This peel and pull method may result in desired features 44 being left intact on the transfer layer 18 and substrate 20 without undesirable shearing.

A second peel and pull method is illustrated in FIGS. 50A, 50B, 50C, In the second peel and pull method, one or more piezo actuators 502 may be installed adjacent to the template. The one or more piezo actuators 502 may be used to induce a relative tilt between template 12 and substrate 20 (FIG. 50A). An end of piezo actuator 502 may be in contact with substrate 20. Thus, if actuator 502 is enlarged (FIG. 50B), template 12 may be pushed away from substrate 20; thus inducing an angle between them. A Z-axis motion between the template 12 and substrate 20 (FIG. 50C), may then be used to separate template 12 and substrate 20. An end of actuator 502 may be surface treated similar to the treatment of the lower surface of template 12 in order to prevent the imprinted layer from sticking to the surface of the actuator.

In summary, embodiments presented herein disclose systems, processes and related devices for successful imprint lithography without requiring the use of high temperatures or high pressures. With certain embodiments, precise control of the gap between a template and a substrate on which desired features from the template are to be transferred may be achieved. Moreover, separation of the template from the substrate (and the imprinted layer) may be possible without destruction or shearing of desired features. Embodiments herein also disclose a way, in the form of suitable vacuum chucks, of holding a substrate in place during imprint lithography. Further embodiments include, a high precision X-Y translation stage suitable for use in an imprint lithography system. Additionally, methods of forming and treating a suitable imprint lithography template are provided.

While this invention has been described with references to various illustrative embodiments, the description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. An imprint lithography system having a template, said system comprising:
    a mount to hold said template; and
    a device coupled to said mount to vary dimensions of said template.

2. The system as recited in claim 1, wherein said device includes a member to vary a temperature of said template to cause said dimensions to vary.

3. The system as recited in claim 1, wherein said device further includes a plurality of piezo actuators attached to apply a force to said template and vary said dimensions.

4. The system as recited in claim 1, wherein said template further includes two sides extending transversely to each other, and said device includes a plurality of piezo actuators, with more than ore of said plurality of piezo actuators being coupled to each of said two sides to apply a force thereto.

5. The system as recited in claim 1, wherein said template further includes two sides extending transversely to each other, and said device further includes a plurality of piezo actuators attached to apply a force to said two sides and alter said dimensions.

6. The system as recited in claim 1, wherein said template further includes two sides disposed opposite to each other, and said device includes a plurality of piezo actuators, with more than one of said plurality of piezo actuators being coupled to each of said two sides to apply a force thereto.

7. The system as recited in claim 1, wherein said template further includes two sides disposed opposite to each other, and said device further includes a plurality of piezo actuators attached to apply a force to said two sides and alter said dimensions.

8. The system as recited in claim 1, wherein said template further includes a plurality of sides, and said device includes a plurality of piezo actuators, with more than one of said plurality of piezo actuators coupled to each of said plurality of sides to apply a force thereto.

9. The system as recited in claim 1, wherein said template further includes a plurality of sides, and said device further includes a plurality of piezo actuators, with one of said plurality of piezo actuators being coupled to each of said plurality of sides to apply a force thereto.

10. The system as recited in claim 1, wherein said device includes a piezo actuator attached to apply a force to said template and vary said dimensions.

11. The system as recited in claim 10, wherein said force of said actuator further comprises a compressive force, with said compressive force being applied to at least a portion of the template.

12. The system as recited in claim 10, wherein said force of said actuator further comprises a stretching force, with said stretching force being applied to at least a portion of the template.

13. The system as recited in claim 10, wherein said template further includes template alignment marks and further including a substrate disposed opposite to said template and having substrate alignment marks and first and second fluxes of light, each of said first and second fluxes light having differing characteristics associated therewith, defining first and second characteristics, with said substrate alignment marks and said template alignment marks being responsive to said first characteristics, and defining a first response, and responsive to said second characteristics, defining a second response differing from said first response.

14. An imprint lithography system having a template, said template having template alignment marks, said system comprising:
    a mount to hold said template;
    a stage disposed opposite to said template;
    a substrate disposed on said stage, with said substrate having substrate alignment marks;
    an illumination system to impinge light upon said substrate alignment marks and said template alignment marks;
    a detection system in optical communication with said substrate alignment marks and said template alignment marks; and
    a device coupled to said mount to vary dimensions of said template to place said template alignment marks and said substrate alignment marks in a desired spatial orientation.

15. The system as recited in claim 14, wherein said device further includes a member to vary a temperature of said template to cause said dimensions to vary.

16. The system as recited in claim 14, wherein said template further includes two sides extending transversely to each other, and said device further includes a plurality of piezo actuators attached to apply a force to said two sides and alter said dimensions.

17. The system as recited in claim 14, wherein said template further includes two sides positioned opposite to each other, and said device further includes a plurality of piezo actuators attached to apply a force to said two sides and alter said dimensions.

18. The system as recited in claim 14, wherein said template further includes a plurality of sides, and said device further includes a plurality of piezo actuators attached to apply a force to said plurality of sides and alter said dimensions.

19. The system as recited in claim 14, wherein said illumination system further includes first and second fluxes of light, each of said first and second fluxes light having differing characteristics associated therewith, defining first and second characteristics, with said substrate alignment marks and said template alignment marks being responsive to said first characteristics, and defining a first response, and responsive to said second characteristics, defining a second response differing from said first response.

20. The system as recited in claim 14, wherein said device includes a piezo actuator attached to said mount to apply a force to vary said dimensions.

21. The system as recited in claim 20, wherein said force comprises a compressive force.

22. The system as recited in claim 20, wherein said force comprises a stretching force.

23. An imprint lithography system having a template, said system comprising:
    a mount to hold said template; and
    a device coupled to said mount to vary dimensions of said template by applying forces to said template, with said forces being selected from a set of forces comprising a compressive force and a stretching force.

24. The imprint lithography system as recited in claim 23, wherein said device includes a plurality of piezo actuators coupled to said template to apply said compressive force along a first axis and said stretching force along a second axis, with said second axis extending transversely to said first axis.

25. The imprint lithography system as recited in claim 23, wherein said device includes a plurality of piezo actuators coupled to said template to apply said compressive force along a first axis and a heating device connected to said mount to create said stretching force along a second axis, with said second axis extending transversely to said first axis.

26. The imprint lithography system as recited in claim 23, wherein said device includes a plurality of piezo actuators coupled to said template to apply said compressive force along first and second axes, with said first axis extending transversely to said second axis.

27. The imprint lithography system as recited in claim 23 further including a heating system in thermal communication with said template to expand said template along two transverse axes.

28. The imprint lithography system as recited in claim 23 further including a heating system in thermal communication with said template to constrict said template along two transverse axes.

* * * * *